(12) United States Patent
Gutman et al.

(10) Patent No.: US 11,901,909 B2
(45) Date of Patent: Feb. 13, 2024

(54) DYNAMIC RANGE ADJUSTMENT FOR ANALOG-TO-DIGITAL CONVERTER (ADC)

(71) Applicant: QUALCOMM Incorporated, San Diego, CA (US)

(72) Inventors: Igor Gutman, Hod HaSharon (IL); Behnam Sedighi, La Jolla, CA (US); Tao Luo, San Diego, CA (US); Elias Dagher, Laguna Niguel, CA (US); Jeremy Darren Dunworth, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/664,358

(22) Filed: May 20, 2022

(65) Prior Publication Data

US 2023/0378970 A1    Nov. 23, 2023

(51) Int. Cl.
  H03M 1/18    (2006.01)
(52) U.S. Cl.
  CPC ........... H03M 1/188 (2013.01); H03M 1/185 (2013.01)
(58) Field of Classification Search
  CPC .............................. H03M 1/185; H03M 1/188
  See application file for complete search history.

(56) References Cited

U.S. PATENT DOCUMENTS

| | | | |
|---|---|---|---|
| 6,285,305 B1 | 9/2001 | Feld et al. | |
| 9,912,348 B1* | 3/2018 | Baringer | H04B 1/0014 |
| 10,749,557 B1* | 8/2020 | Griffin | H04B 17/3913 |
| 10,749,661 B1* | 8/2020 | Visani | H04L 1/205 |
| 11,228,328 B1* | 1/2022 | Veyseh | H04B 1/0475 |
| 2004/0116092 A1 | 6/2004 | Hessel et al. | |
| 2010/0052958 A1 | 3/2010 | Roeven et al. | |
| 2010/0245140 A1 | 9/2010 | Iso et al. | |
| 2015/0138006 A1* | 5/2015 | Straeussnigg | H03M 1/164 341/155 |
| 2020/0091608 A1 | 3/2020 | Alpman et al. | |
| 2020/0145592 A1* | 5/2020 | Iwakiri | A61B 6/4283 |
| 2020/0162099 A1* | 5/2020 | Perrott | H03M 3/354 |
| 2022/0190800 A1* | 6/2022 | Turvey | H03G 3/30 |

OTHER PUBLICATIONS

International Search Report and Written Opinion dated Sep. 25, 2023 from corresponding PCT Application No. PCT/US2023/066472.

* cited by examiner

*Primary Examiner* — Lam T Mai
(74) *Attorney, Agent, or Firm* — ArentFox Schiff LLP

(57) ABSTRACT

Certain aspects are directed to an apparatus configured for wireless communication. The apparatus may include a memory comprising instructions, and one or more processors configured to execute the instructions. In some examples, the one or more processors are configured to cause the apparatus to obtain a sample of an analog signal. In some examples, the one or more processors are configured to cause the apparatus to output the sample to an analog-to-digital converter (ADC) via one of at least a first path or a second path based at least in part on whether the sample satisfies a first threshold condition or a second threshold condition.

20 Claims, 12 Drawing Sheets

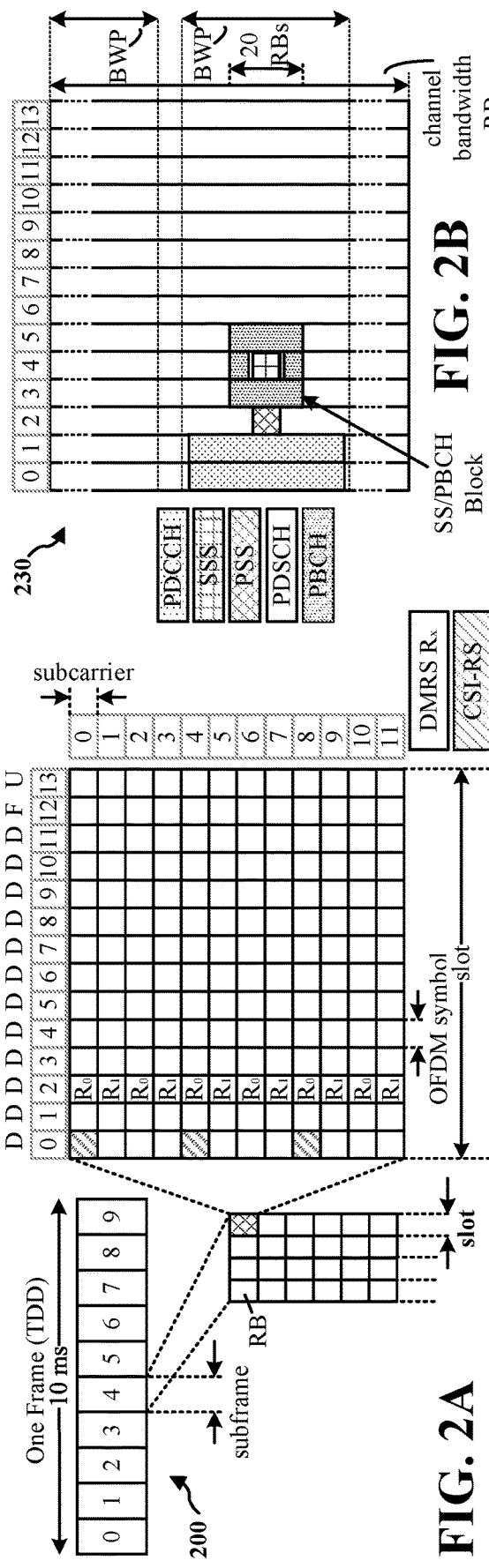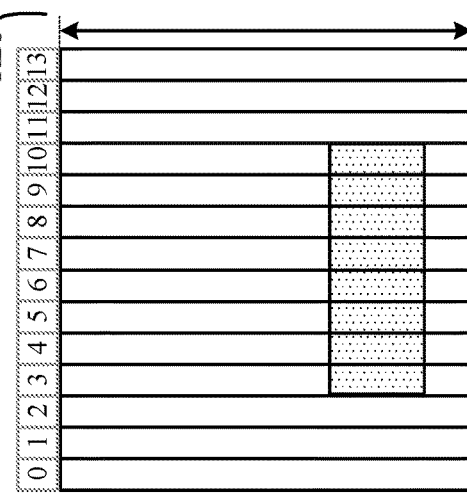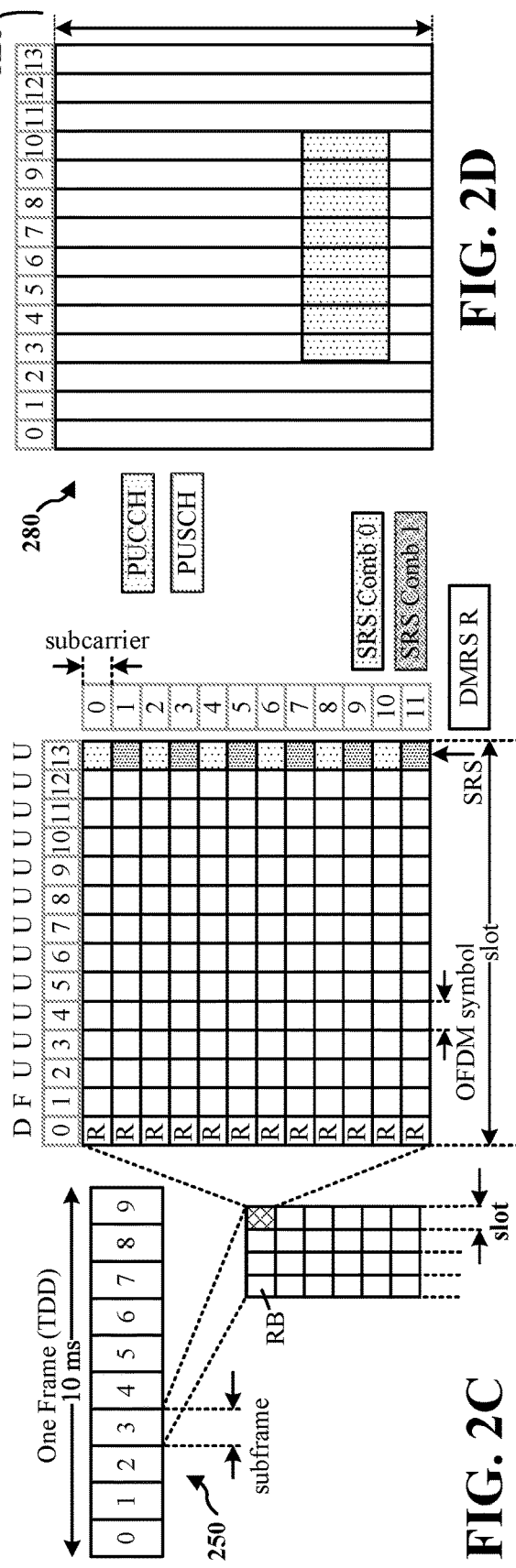
FIG. 2A  FIG. 2B  FIG. 2C  FIG. 2D

DYNAMIC RANGE ADJUSTMENT FOR ANALOG-TO-DIGITAL CONVERTER (ADC)

BACKGROUND

Technical Field

The present disclosure generally relates to communication systems, and more particularly, to enabling an extended range capability of an analog-to-digital converter (ADC).

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

For example, some aspects of wireless communication include direct communication between devices, such as device-to-device (D2D), vehicle-to-everything (V2X), and the like. There exists a need for further improvements in such direct communication between devices. Improvements related to direct communication between devices may be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

Certain aspects are directed to an apparatus configured for wireless communication. In some examples, the apparatus includes a memory comprising instructions, and one or more processors configured to execute the instructions. In some examples, the one or more processors are configured to cause the apparatus to obtain a sample of an analog signal. In some examples, the one or more processors are configured to cause the apparatus to output the sample to the ADC via one of at least a first path or a second path based at least in part on whether the sample satisfies a first threshold condition or a second threshold condition.

Certain aspects are directed to a method for wireless communication at a wireless node. In some examples, the method includes obtaining a sample of an analog signal. In some examples, the method includes outputting the sample to an analog-to-digital converter (ADC) via one of at least a first path or a second path based at least in part on whether the sample satisfies a first threshold condition or a second threshold condition.

Certain aspects are directed to an apparatus configured for wireless communication. In some examples, the apparatus includes means for obtaining a sample of an analog signal. In some examples, the apparatus includes means for outputting the sample to an analog-to-digital converter (ADC) via one of at least a first path or a second path based at least in part on whether the sample satisfies a first threshold condition or a second threshold condition.

Certain aspects are directed to a non-transitory computer-readable medium having instructions stored thereon that, when executed by a wireless node, cause the wireless node to perform operations. In some examples, the operations include obtaining a sample of an analog signal. In some examples, the operations include outputting the sample to an analog-to-digital converter (ADC) via one of at least a first path or a second path based at least in part on whether the sample satisfies a first threshold condition or a second threshold condition.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIG. 2A is a diagram illustrating an example of a first frame, in accordance with various aspects of the present disclosure.

FIG. 2B is a diagram illustrating an example of downlink channels within a subframe, in accordance with various aspects of the present disclosure.

FIG. 2C is a diagram illustrating an example of a second frame, in accordance with various aspects of the present disclosure.

FIG. 2D is a diagram illustrating an example of UL channels within a subframe, in accordance with various aspects of the present disclosure.

DETAILED DESCRIPTION

Figure 1:
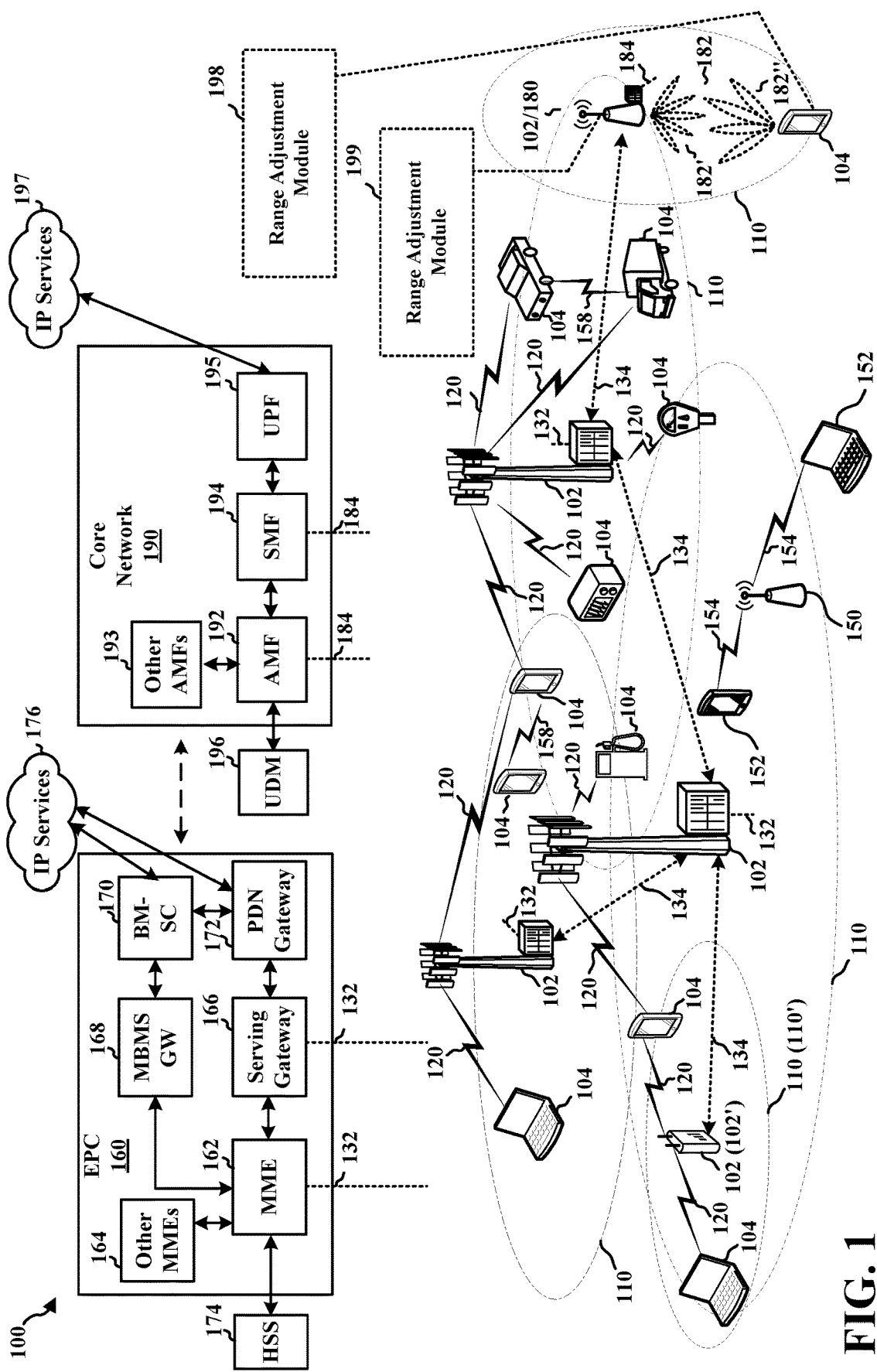
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

A primary problem with full-duplex and dynamic time division duplex (D-TDD) communications is interference which may be classified into at least the following groups: (i) directed self-interference (DSI): wherein a device transmitting a signal receives the transmitted signal as interference; (ii) indirect self-interference (IDSI): wherein the device transmitting the signal receives a reflection of the transmitted signal as interference; or (iii) cross-link interference (CI): wherein the device receives interference from a signal transmitted by an adjacent device.

Interference from such sources may add to a legitimate signal that is transmitted to the device, resulting in an increase of the amplitude of the legitimate signal as it is received by the device. Such interference may overwhelm an analog to digital converter (ADC) on the receiving device. For example, the ADC may have an input voltage range defined by a maximum voltage and minimum voltage. That is, the ADC is configured to convert analog signals to digital signals within that voltage range. When the input signal is outside of the input voltage range, the ADC may "clip" the signal and generate a digital signal that is based on the maximum/minimum voltage instead of the actual voltage of the analog signal. Accordingly, when a legitimate signal is subject to interference that adds to the legitimate signal, the ADC input of that signal may be outside of the input voltage range due to the interference. As such, the signal may be clipped, which may degrade communications.

Thus, in certain aspects, a wrapper may be added to the ADC in order to dynamically enhance the input voltage range of the ADC. For example, a range detector may be configured to receive the input analog signal samples and determine whether an input analog signal sample is within the input voltage range of the ADC. That is, the range detector may determine whether an analog signal is within the input voltage range of the ADC on a sample-by-sample basis. If the signal is within the ADC's input voltage range, then the range detector may provide a path for the signal to pass directly to the ADC. If the signal is outside of the ADC's input voltage range, then the range detector may provide another path for the signal to first pass through an attenuator prior to the ADC. In this case, the attenuator may reduce the voltage of the signal so that it is within the ADC input voltage range. The ADC may then generate a digital signal based on the attenuated analog signal and pass the digital signal to an amplifier configured to amplify the digital signal to offset the attenuation of the associated analog signal. For example, if the attenuator scales the analog signal by 1/G, then the amplifier may amplify the digital signal by G. In this manner, the analog signal is not clipped as a result of the input voltage limitations of the ADC, and the digital signal accurately represents the received analog signal. As such, by using the ADC wrapper and range detector, the wireless device may effectively extend the ADC resolution despite any input voltage range limitations of the ADC by dynamically attenuating signals that fall outside of the input voltage range then amplifying the resulting digital signal. Thus, even if other signals interfere with a signal intended for the wireless device by adding to it, the wireless device In certain aspects, a first device (e.g., a base station or a user equipment (UE)) may provide a second device (e.g., another UE) with assistance information configured to notify the second device of whether one or more other devices in the same cell or in a region/location are communicating according to a particular duplex. For example, the assistance information may provide the second device with information indicating that one or more devices within the cell or region are communicating using a static time-division duplex (S-TDD) operation, a dynamic time-division duplex (D-TDD) operation, or a full duplex (FD) operation. In this way, the second device may determine whether to use the range detector for ADC operations.

For example, if the assistance information indicates that there is another device nearby that is using D-TDD, FD, or another operation for communication that may cause interference, then the second device may determine to use the range detector because signaling from the other device may add to the signals intended for the second device (e.g., increase the amplitude of the signals intended for the second device causing them to fall outside of the input voltage range of the ADC). If the nearby device is using only D-TDD or similar operations for communications that will likely not cause interference, then the second device may determine not to use the range detector, and instead pass samples of received signals directly to the ADC. In some examples, the second device may request assistance information from a base station or, in some examples, another UE in a sidelink communication. In some examples, the assistance information and the request may be transmitted over any suitable Layer 2 or Layer 3 signaling, such as a radio resource control (RRC) message or a medium access control (MAC) control element (CE).

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. A variety of integrated circuits including analog-to-digital (ADC), digital-to-analog converters (DAC), voltage regulators and power management circuits are also typically included in processing system. For example, a baseband processor (e.g., baseband digital modem) may convert received analog signals to the digital domain using one or more ADCs, and perform digital processing on the signals using one or more DSPs. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, user equipment(s) (UE) 104, an Evolved Packet Core (EPC) 160, and another core network 190 (e.g., a Core (5GC)). The base stations 102 may include macrocells (high power cellular base station) and/or small cells (low power cellular base station). The macrocells include base stations. The small cells include femtocells, picocells, and microcells.

The base stations 102 configured for 4G Long Term Evolution (LTE) (collectively referred to as Evolved Universal Mobile Telecommunications System (UMTS) Terrestrial Radio Access Network (E-UTRAN)) may interface with the EPC 160 through first backhaul links 132 (e.g., S1 interface). The base stations 102 configured for 5G New Radio (NR) (collectively referred to as Next Generation RAN (NG-RAN)) may interface with core network 190 through second backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, Multimedia Broadcast Multicast Service (MBMS), subscriber and equipment trace, RAN information management (RIM), paging, positioning, and delivery of warning messages. The base stations 102 may communicate directly or indirectly (e.g., through the EPC 160 or core network 190) with each other over third backhaul links 134 (e.g., X2 interface). The first backhaul links 132, the second backhaul links 184, and the third backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNB s) (HeNB s), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y megahertz (MHz) (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell). Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, WiMedia, Bluetooth, ZigBee, Wi-Fi based on the Institute of Electrical and Electronics Engineers (IEEE) 802.11 standard, LTE, or NR.

The wireless communications system may further include a Wi-Fi access point (AP) 150 in communication with Wi-Fi stations (STAs) 152 via communication links 154, e.g., in a 5 gigahertz (GHz) unlicensed frequency spectrum or the like. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same unlicensed frequency spectrum (e.g., 5 GHz, or the like) as used by the Wi-Fi AP 150. The small cell 102', employing NR in an unlicensed frequency spectrum, may boost coverage to and/or increase capacity of the access network.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). The frequencies between FR1 and FR2 are often referred to as mid-band frequencies. Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, or may be within the EHF band.

A base station 102, whether a small cell 102' or a large cell (e.g., macro base station), may include and/or be referred to as an eNB, gNodeB (gNB), or another type of base station. Some base stations, such as gNB 180 may operate in a traditional sub 6 GHz spectrum, in millimeter wave frequencies, and/or near millimeter wave frequencies in communication with the UE 104. When the gNB 180 operates in millimeter wave or near millimeter wave frequencies, the gNB 180 may be referred to as a millimeter wave base station. The millimeter wave base station 180 may utilize beamforming 182 with the UE 104 to compensate for the path loss and short range. The base station 180 and the UE 104 may each include a plurality of antennas, such as antenna elements, antenna panels, and/or antenna arrays to facilitate the beamforming. The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, an MBMS Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides Quality of Service (QoS) flow and session management. All user IP packets are transferred through the UPF 195. The UPF 195 provides UE IP address allocation as well as other functions. The UPF 195 is connected to the IP Services 197. The IP Services 197 may include the Internet, an intranet, an IMS, a Packet Switch (PS) Streaming Service, and/or other IP services.

The base station may include and/or be referred to as a gNB, Node B, eNB, an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Although the present disclosure may focus on 5G NR, the concepts and various aspects described herein may be applicable to other similar areas, such as LTE, LTE-Advanced (LTE-A), Code Division Multiple Access (CDMA), Global System for Mobile communications (GSM), or other wireless/radio access technologies.

Referring again to FIG. 1, in certain aspects, the UE 104 may include a range adjustment module 198 configured to obtain a sample of an analog signal, and output the sample to an analog-to-digital converter (ADC) via one of at least a first path or a second path based at least in part on whether the sample satisfies a first threshold condition or a second threshold condition.

Referring again to FIG. 1, in certain aspects, the base station 102/180 may include a range adjustment module 199 configured to obtain a sample of an analog signal, and output the sample to an analog-to-digital converter (ADC) via one of at least a first path or a second path based at least in part on whether the sample satisfies a first threshold condition or a second threshold condition.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 34 (with mostly UL). While subframes 3, 4 are shown with slot formats 34, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a NR frame structure that is TDD.

Other wireless communication technologies may have a different frame structure and/or different channels. A frame, e.g., of 10 milliseconds (ms), may be divided into equally sized subframes (1 ms). Each subframe may include one or more time slots. Subframes may also include mini-slots, which may include 7, 4, or 2 symbols. Each slot may include 7 or 14 symbols, depending on the slot configuration. For slot configuration 0, each slot may include 14 symbols, and for slot configuration 1, each slot may include 7 symbols. The symbols on DL may be cyclic prefix (CP) orthogonal frequency-division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the slot configuration and the numerology. For slot configuration different numerologies id 0 to 4 allow for 1, 2, 4, 8, and 16 slots, respectively, per subframe. For slot configuration 1, different numerologies 0 to 2 allow for 2, 4, and 8 slots, respectively, per subframe. Accordingly, for slot configuration 0 and numerology μ, there are 14 symbols/slot and $2^\mu$ slots/subframe. The subcarrier spacing and symbol length/duration are a function of the numerology. The subcarrier spacing may be equal to $2^\mu * 15$ kilohertz (kHz), where μ is the numerology 0 to 4. As such, the numerology μ=0 has a subcarrier spacing of 15 kHz and the numerology μ=4 has a subcarrier spacing of 240 kHz. The symbol length/duration is inversely related to the subcarrier spacing. FIGS. 2A-2D provide an example of slot configuration 0 with 14 symbols per slot and numerology μ=2 with 4 slots per subframe. The slot duration is 0.25 ms, the subcarrier spacing is 60 kHz, and the symbol duration is approximately 16.67 μs. Within a set of frames, there may be one or more different bandwidth parts (BWPs) (see FIG. 2B) that are frequency division multiplexed. Each BWP may have a particular numerology.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as $R_x$ for one particular configuration, where 100x is the port number, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol. A PDCCH within one BWP may be referred to as a control resource set (CORESET). Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIB s), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgement (ACK)/non-acknowledgement (NACK) feedback. The PUSCH carries data, and may additionally be used to carry a buffer status report (BSR), a power headroom report (PHR), and/or UCI.

Figure 3:
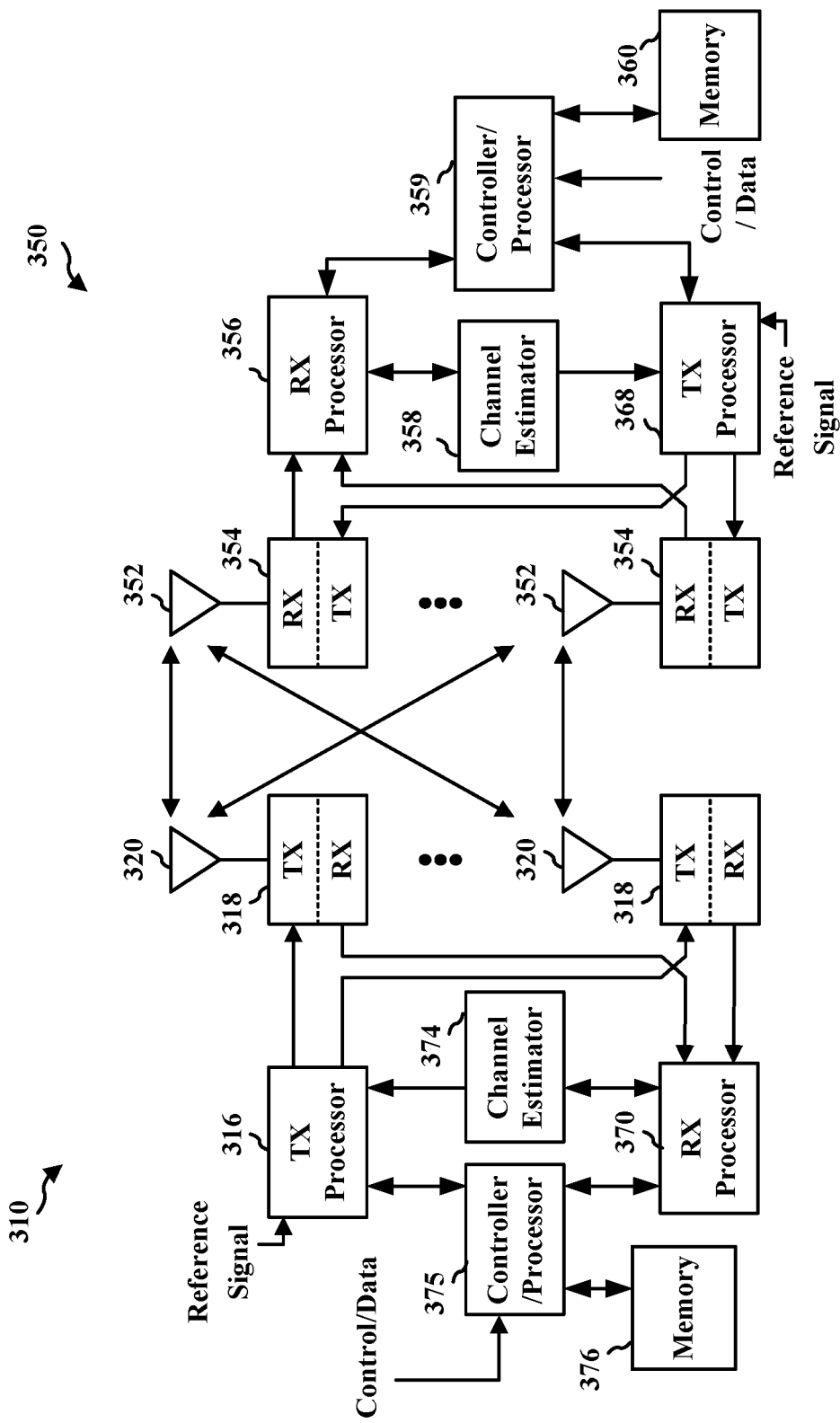
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIB s), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality. The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIB s) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

At least one of the TX processor 368, the RX processor 356, and the controller/processor 359 may be configured to perform aspects in connection with the range adjustment module 198 of FIG. 1.

At least one of the TX processor 316, the RX processor 370, and the controller/processor 375 may be configured to perform aspects in connection with range adjustment module 199 of FIG. 1.

Figure 4:
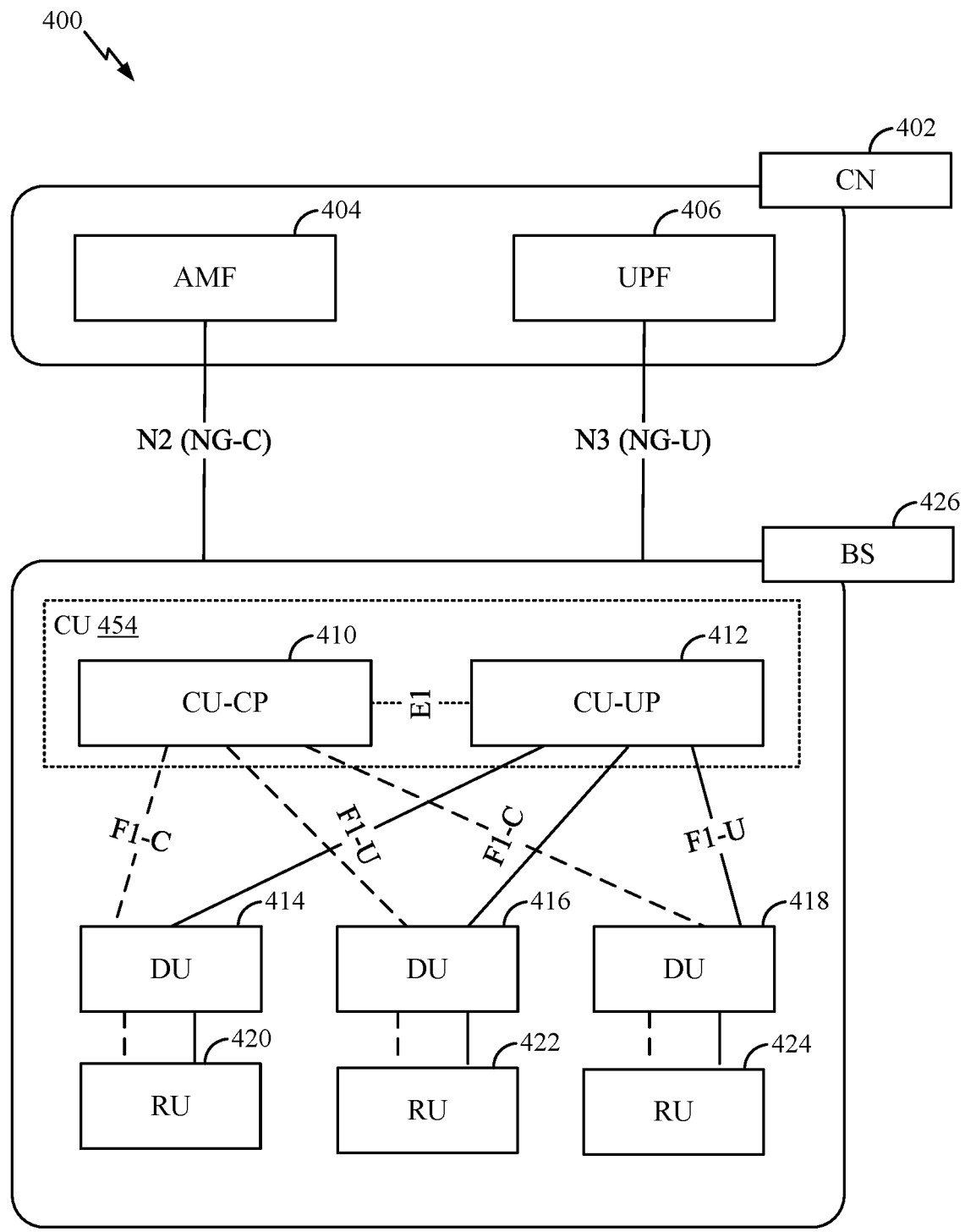
FIG. 4 is a block diagram illustrating an example monolithic (e.g., disaggregated) architecture of a distributed radio access network (RAN).

FIG. 4 is a block diagram illustrating an example monolithic (e.g., disaggregated) architecture of a distributed RAN 400, which may be implemented in the wireless communications system and an access network 100 illustrated in FIG. 1. As illustrated, the distributed RAN 400 includes core network (CN) 402 and a base station 426.

The CN 402 may host core network functions. CN 402 may be centrally deployed. CN 402 functionality may be offloaded (e.g., to advanced wireless services (AWS)), in an effort to handle peak capacity. The CN 402 may include an AMF 404 and a UPF 406. The AMF 404 and UPF 406 may perform one or more of the core network functions.

The base station 426 may communicate with the CN 402 (e.g., via a backhaul interface). The base station 426 may communicate with the AMF 404 via an N2 (e.g., NG-C) interface. The base station 426 may communicate with the UPF 406 via an N3 (e.g., NG-U) interface. The base station 426 may include a central unit-control plane (CU-CP) 410, one or more central unit-user planes (CU-UPs) 412, one or more distributed units (DUs) 414-418, and one or more radio units (RUs) 420-424.

The CU-CP 410 may be connected to one or more of the DUs 414-418. The CU-CP 410 and DUs 414-418 may be connected via a F1-C interface. As shown in FIG. 4, the CU-CP 410 may be connected to multiple DUs, but the DUs may be connected to only one CU-CP. Although FIG. 4 only illustrates one CU-UP 412, the base station 426 may include multiple CU-UPs. The CU-CP 410 selects the appropriate CU-UP(s) for requested services (e.g., for a UE). The CU-UP(s) 412 may be connected to the CU-CP 410. For example, the CU-UP(s) 412 and the CU-CP 410 may be connected via an E1 interface. The CU-UP(s) 412 may be connected to one or more of the DUs 414-418. The CU-UP(s) 412 and DUs 414-418 may be connected via a F1-U interface. As shown in FIG. 4, the CU-CP 410 may be connected to multiple CU-UPs, but the CU-UPs may be connected to only one CU-CP 410.

A DU, such as DUs 414, 416, and/or 418, may host one or more TRP(s) (transmit/receive points, which may include an edge node (EN), an edge unit (EU), a radio head (RH), a smart radio head (SRH), or the like). A DU may be located at edges of the network with radio frequency (RF) functionality. A DU may be connected to multiple CU-UPs that are connected to (e.g., under the control of) the same CU-CP (e.g., for RAN sharing, radio as a service (RaaS), and service specific deployments). DUs may be configured to individually (e.g., dynamic selection) or jointly (e.g., joint transmission) serve traffic to a UE. Each DU 414-416 may be connected with one of RUs 420/422/424.

The CU-CP 410 may be connected to multiple DU(s) that are connected to (e.g., under control of) the same CU-UP 412. Connectivity between a CU-UP 412 and a DU may be established by the CU-CP 410. For example, the connectivity between the CU-UP 412 and a DU may be established using bearer context management functions. Data forwarding between CU-UP(s) 412 may be via a Xn-U interface.

The distributed RAN 400 may support fronthauling solutions across different deployment types. For example, the RAN 400 architecture may be based on transmit network capabilities (e.g., bandwidth, latency, and/or jitter). The distributed RAN 400 may share features and/or components with LTE. For example, the base station 426 may support dual connectivity with NR and may share a common fronthaul for LTE and NR. The distributed RAN 400 may enable cooperation between and among DUs 414-418, for example, via the CU-CP 412. An inter-DU interface may not be used. Logical functions may be dynamically distributed in the distributed RAN 400.

Figure 5:
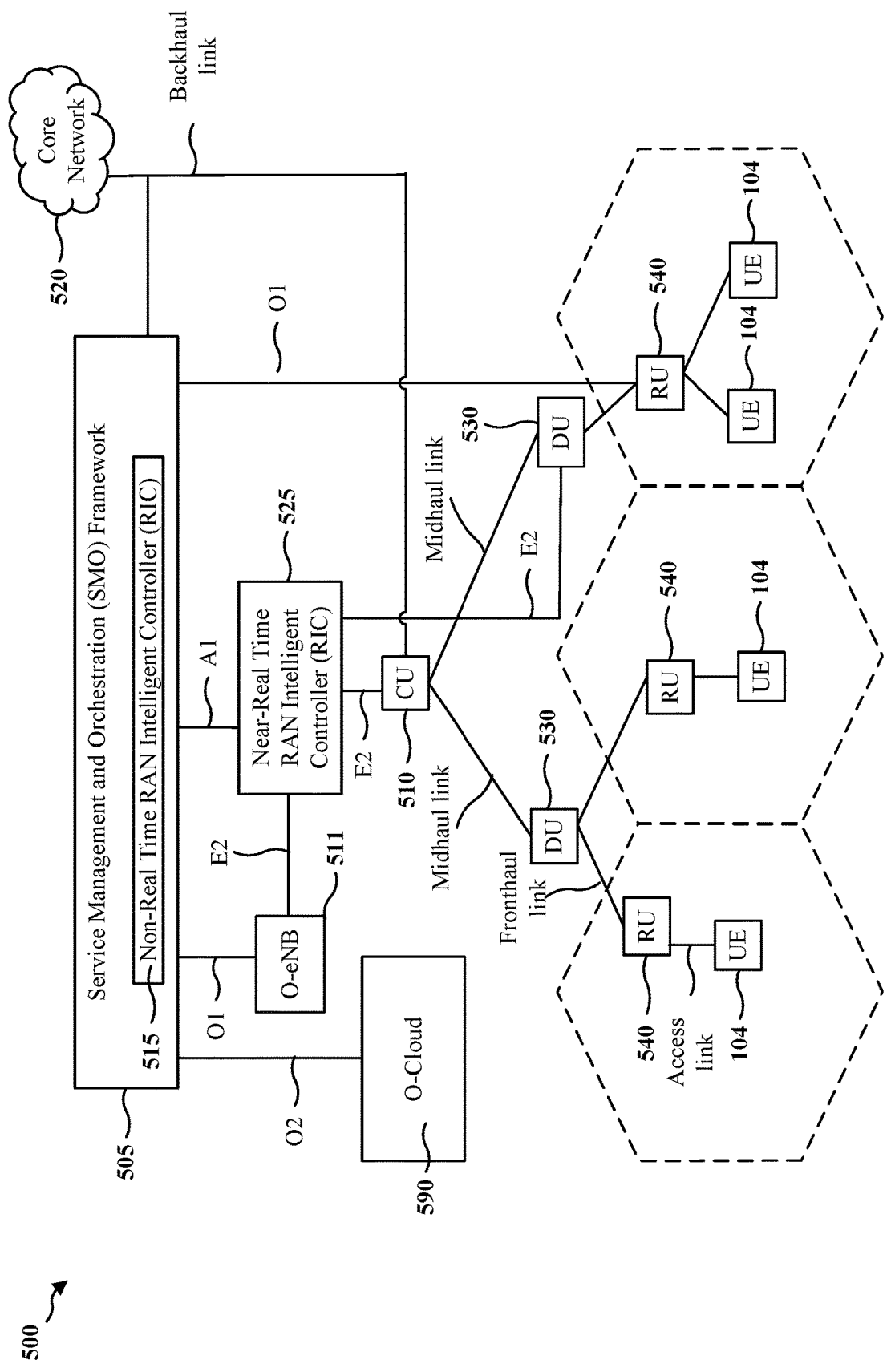
FIG. 5 is a block diagram illustrating an example disaggregated base station architecture.

FIG. 5 is a block diagram illustrating an example disaggregated base station 500 architecture. The disaggregated base station 500 architecture may include one or more CUs 510 that can communicate directly with a core network 520 via a backhaul link, or indirectly with the core network 520 through one or more disaggregated base station units (such as a near real-time (RT) RIC 525 via an E2 link, or a non-RT RIC 515 associated with a service management and orchestration (SMO) Framework 505, or both). A CU 510 may communicate with one or more DUs 530 via respective midhaul links, such as an F1 interface. The DUs 530 may communicate with one or more RUs 540 via respective fronthaul links. The RUs 540 may communicate with respective UEs 104 via one or more radio frequency (RF) access links. In some implementations, the UE 104 may be simultaneously served by multiple RUs 540.

Each of the units, i.e., the CUs 510, the DUs 530, the RUs 540, as well as the near-RT RICs 525, the non-RT RICs 515 and the SMO framework 505, may include one or more interfaces or be coupled to one or more interfaces configured to receive or transmit signals, data, or information (collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or transmit signals over a wired transmission medium to one or more of the other units. Additionally, the units can include a wireless interface, which may include a receiver, a transmitter or transceiver (such as a radio frequency (RF) transceiver), configured to receive or transmit signals, or both, over a wireless transmission medium to one or more of the other units.

In some aspects, the CU 510 may host higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 510. The CU 510 may be configured to handle user plane functionality (i.e., central unit—user plane (CU-UP)), control plane functionality (i.e., central unit—control plane (CU-CP)), or a combination thereof. In some implementations, the CU 510 can be logically split into one or more CU-UP units and one or more CU-CP units. The CU-UP unit can communicate bidirectionally with the CU-CP unit via an interface, such as the E1 interface when implemented in an O-RAN configuration. The CU 510 can be implemented to communicate with the DU 530, as necessary, for network control and signaling.

The DU 530 may correspond to a logical unit that includes one or more base station functions to control the operation of one or more RUs 540. In some aspects, the DU 530 may host one or more of a radio link control (RLC) layer, a medium access control (MAC) layer, and one or more high physical (PHY) layers (such as modules for forward error correction (FEC) encoding and decoding, scrambling, modulation and demodulation, or the like) depending, at least in part, on a functional split, such as those defined by the 3$^{rd}$ Generation Partnership Project (3GPP). In some aspects, the DU 530 may further host one or more low PHY layers. Each layer (or module) can be implemented with an interface configured to communicate signals with other layers (and modules) hosted by the DU 530, or with the control functions hosted by the CU 510.

Lower-layer functionality can be implemented by one or more RUs 540. In some deployments, an RU 540, controlled by a DU 530, may correspond to a logical node that hosts RF processing functions, or low-PHY layer functions (such as performing fast Fourier transform (FFT), inverse FFT (iFFT), digital beamforming, physical random access channel (PRACH) extraction and filtering, or the like), or both, based at least in part on the functional split, such as a lower layer functional split. In such an architecture, the RU(s) 540 can be implemented to handle over the air (OTA) communication with one or more UEs 104. In some implementations, real-time and non-real-time aspects of control and user plane communication with the RU(s) 540 can be controlled by the corresponding DU 530. In some scenarios, this configuration can enable the DU(s) 530 and the CU 510 to be implemented in a cloud-based RAN architecture, such as a virtual RAN (vRAN) architecture.

The SMO Framework 505 may be configured to support RAN deployment and provisioning of non-virtualized and virtualized network elements. For non-virtualized network elements, the SMO framework 505 may be configured to support the deployment of dedicated physical resources for RAN coverage requirements, which may be managed via an operations and maintenance interface (such as an O1 interface). For virtualized network elements, the SMO framework 505 may be configured to interact with a cloud computing platform (such as an open cloud (O-cloud) 590) to perform network element life cycle management (such as to instantiate virtualized network elements) via a cloud computing platform interface (such as an O2 interface). Such virtualized network elements can include, but are not limited to, CUs 510, DUs 530, RUs 540 and near-RT RICs 525. In some implementations, the SMO framework 505 can communicate with a hardware aspect of a 4G RAN, such as an open eNB (O-eNB) 511, via an O1 interface. Additionally, in some implementations, the SMO Framework 505 can communicate directly with one or more RUs 540 via an O1 interface. The SMO framework 505 also may include the non-RT RIC 515 configured to support functionality of the SMO Framework 505.

The non-RT RIC 515 may be configured to include a logical function that enables non-real-time control and optimization of RAN elements and resources, artificial intelligence/machine learning (AI/ML) workflows including model training and updates, or policy-based guidance of applications/features in the near-RT RIC 525. The non-RT RIC 515 may be coupled to or communicate with (such as via an A1 interface) the near-RT RIC 525. The near-RT RIC 525 may be configured to include a logical function that enables near-real-time control and optimization of RAN elements and resources via data collection and actions over an interface (such as via an E2 interface) connecting one or more CUs 510, one or more DUs 530, or both, as well as an O-eNB, with the near-RT RIC 525.

In some implementations, to generate AI/ML models to be deployed in the near-RT RIC 525, the non-RT RIC 515 may receive parameters or external enrichment information from external servers. Such information may be utilized by the near-RT RIC 525 and may be received at the SMO Framework 505 or the non-RT RIC 515 from non-network data sources or from network functions. In some examples, the non-RT RIC 515 or the near-RT RIC 525 may be configured to tune RAN behavior or performance. For example, the non-RT RIC 515 may monitor long-term trends and patterns for performance and employ AI/ML models to perform corrective actions through the SMO Framework 505 (such as reconfiguration via O1) or via creation of RAN management policies (such as A1 policies).

Figure 6:
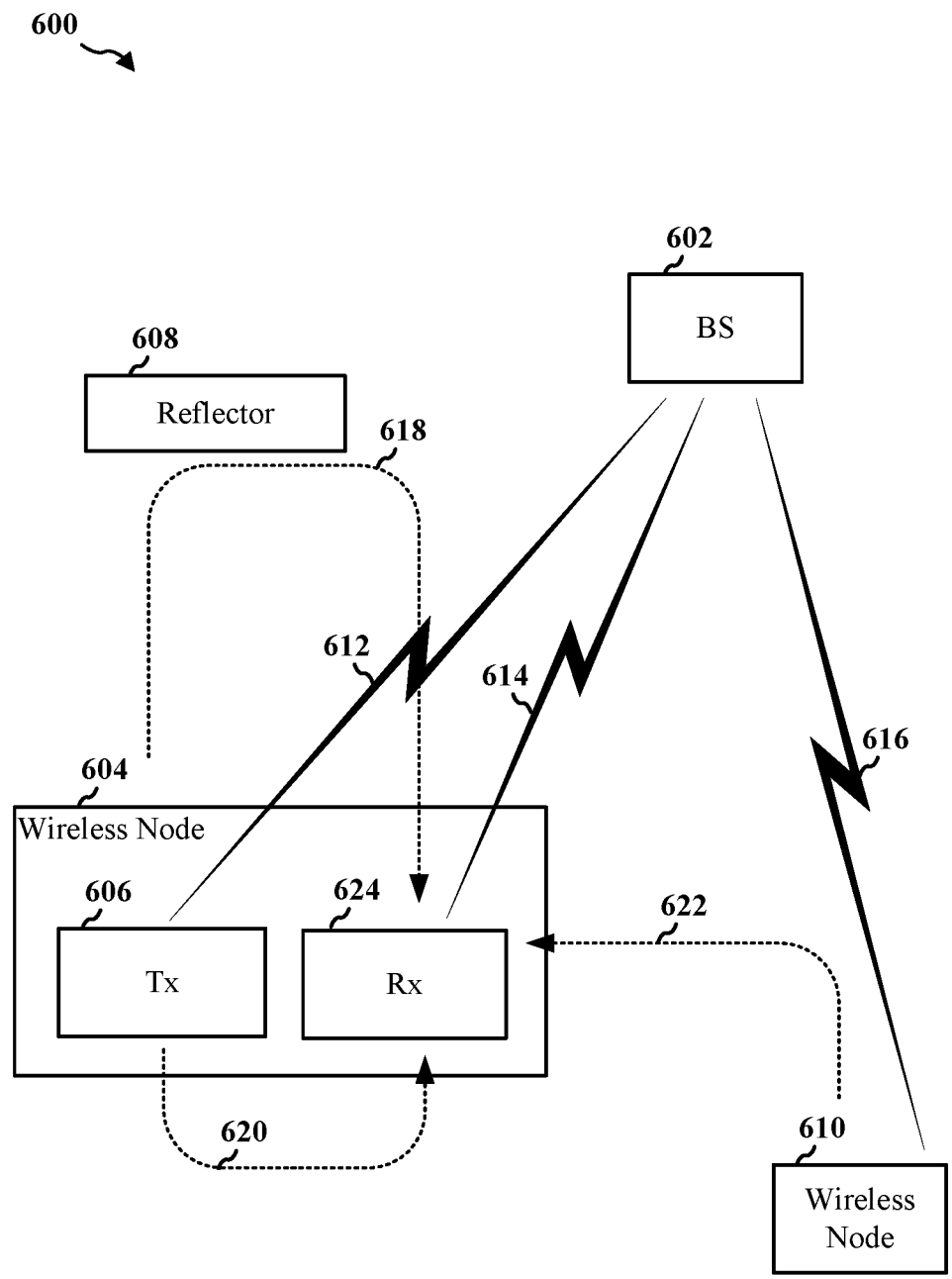
FIG. 6 is a block diagram illustrating example interference from the perspective of a first wireless node configured for full-duplex and/or D-TDD communications.

FIG. 6 is a block diagram illustrating example interference 600 from the perspective of a first wireless node 604 (e.g., a UE 104 or base station 102/180 of FIG. 1, or a relay/repeater). The first wireless node 604 may be configured for full-duplex and/or D-TDD communications. Here, a base station 602 (e.g., base station 102/180 of FIG. 1) also configured for full-duplex and/or D-TDD communications simultaneously transmits a downlink signal 614 intended to be received via a receiving antenna 624 of the first wireless node 604. The first wireless node 604 simultaneously transmits an uplink signal 612 to the base station 602 via a transmitting antenna 606. A second wireless node 610 (e.g., a UE 104 or base station 102/180 of FIG. 1, or a relay/repeater) in the same area or cell as the first wireless node 604 is transmitting another uplink signal 616 to the base station 602 during transmission of the downlink signal 614 and transmission of the uplink signal 612.

As illustrated, portions of the uplink signal 612 may be reflected back to the first wireless node 604 via a reflector 608 and received by the receiving antenna 624. In this example, the reflected portions of the uplink signal 612 cause indirect self-interference (IDSI) 618, wherein the first wireless node 604 is a source of interference to itself via some reflector 608.

Moreover, portions of the uplink signal 612 may leak back to the first wireless node's 604 receiving antenna 624 due, for example, to the close proximity of the transmitting antenna 606 to the receiving antenna 624. In this example, the portions of the uplink signal 612 cause direct self-interference (DSI) 620, wherein the first wireless node 604 is a direct source of interference to itself.

Further, portions of the other uplink signal 616 may leak into the downlink signal 614 and/or into the receiving antenna 624 due to the close proximity of the second wireless node 610 to the first wireless node and/or the beam direction used by the second wireless node 610. In this example, the other uplink signal 616 causes cross-link interference (CI) 622, wherein the adjacent second wireless node 610 transmits an uplink signal 616 while the first wireless node 604 is receiving a downlink signal 614.

Different types of interferences, such as IDSI 618, DSI 620, CI 622, and others may add to a legitimate signal that a wireless node is intended to receive. The interference may cause the amplitude of the legitimate signal to increase, and in some scenarios, cause the amplitude of the legitimate signal to increase outside of a input voltage range of the wireless node's ADC. For example, if the legitimate signal (e.g., the downlink signal 614 of FIG. 6) has an amplitude that oscillates between +1V to −1V, and the ADC input voltage range is +1 to ~1, but the interference adds ±0.2V to the legitimate signal, then the amplitude of the legitimate signal increases to +1.2V and −1.2V. In other words, the interference causes the legitimate signal to increase by 20%, and because the added ±0.2V is outside of the ADC input voltage range, the ADC will clip the added ±0.2V. Such clipping may reduce the quality and integrity of wireless communications.

Figure 7A:
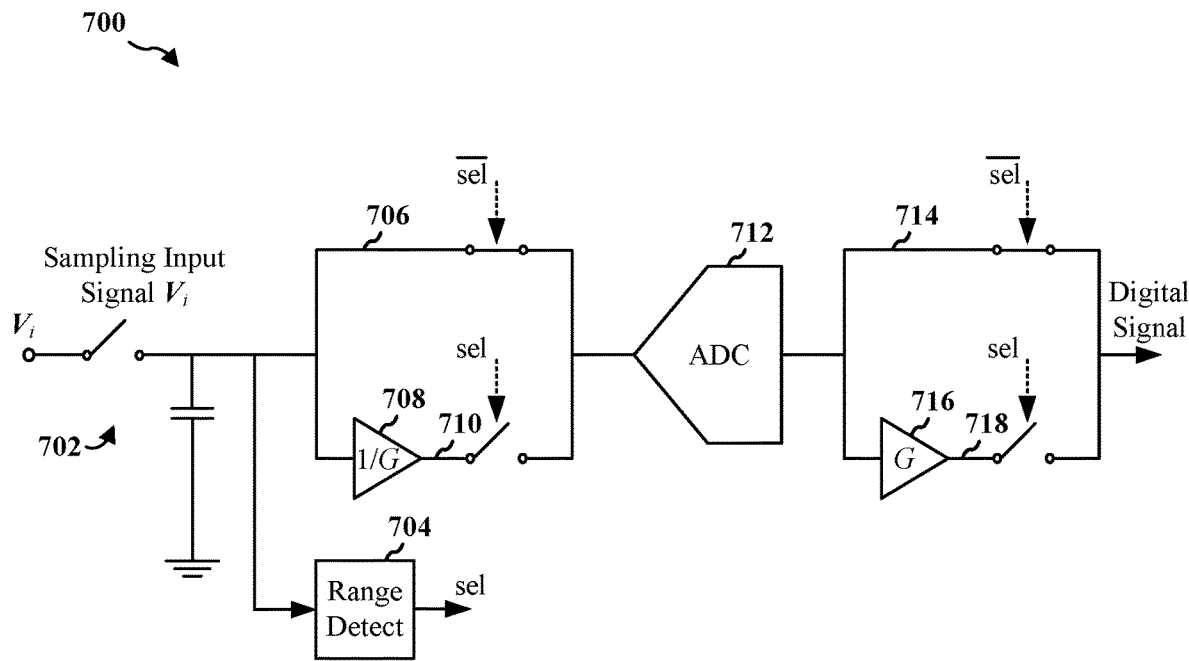
FIG. 7A is a schematic illustrating an example wrapper for an analog to digital converter (ADC).

FIG. 7A is a schematic illustrating an example ADC 712 with a wrapper 700. The wrapper 700 includes a range detector 704 configured to detect a voltage of a sampled input signal ($V_i$) a received analog signal. As illustrated, an input of the range detector 704 is coupled to an output of the sampler 702. It should be noted, however, that the input of the range detector 704 may be coupled directly to the source of $V_i$, or other blocks that generate $V_i$. A sampler 702 includes a switch and a capacitor, and may provide samples of the received analog signal for the ADC 712 according to an N-bit resolution of the ADC 712. It should be noted that the sampler 702 is illustrated as a generic sampling circuit for simplicity of the description; however, actual implementation may vary. The range detector 704 may output a path selection signal (e.g., sel) configured to select: (i) a first path 706 or a second path 710, and (ii) select a third path 714 or a fourth path 718.

The first path 706 and the third path 714 may provide direct paths. For example, the first path 706 may provide a direct path from the sampler 702 to the ADC 712. The Third path 714 may also provide a direct path from the ADC 712 to another integrated circuit outside of the wrapper 700. On the other hand, the second path 710 and the fourth path 718 may provide path with intermediary circuitry. For example, the second path 710 may include an attenuator 708 configured to scale/attenuate samples of the received analog signal by a factor (e.g., 1/G, where G is signal gain) before passing the scaled samples to the ADC 712. The fourth path 718 may include an amplifier 716 configured to amplify a digital signal output from the ADC 712, wherein that digital signal was generated based on a scaled sample of the received analog signal.

Specifically, the wrapper 700 enables the ADC 712 to perform its function on analog signals that exceed the input voltage range of the ADC 712 without resulting in ADC clipping of those signals. Because the range detector 704 receives the plurality of analog samples from the input signal sampler 702, it can determine whether a particular sample is within or outside of the input voltage range of the ADC 712. As illustrated, if a first sample is within the input voltage range, then the first path 706 and the third path 714 are provided to the first sample (e.g., switches on the second path 710 and the fourth path 718 are opened, and switches on the first path 706 and the third path 714 are closed). If the first sample is not within the input voltage range, then the second path 710 and the fourth path 718 are provided to the first sample (e.g., switches on the second path 710 and the fourth path 718 are closed, and switches on the first path 706 and the third path 714 are opened). Opening and closing of the paths may be controlled by an output signal of the range detector 704.

In particular, if the first sample is not within the input voltage range, the first sample is first scaled by the attenuator 708 by a scaling factor (e.g., 1/G) that reduces the amplitude of the first sample so that it is within the input voltage range of the ADC 712, and so that the ADC 712 does not clip the first sample. The scaled first sample is then passed to the ADC 712 to generate a first digital signal based on the scaled first sample. The first digital signal is then passed to the amplifier 716 which amplifies the first digital signal by an amplification factor (e.g., G). In this example, the amplification factor is a function of the scaling factor. Thus, the first digital signal may be amplified to reflect the amplitude of the original first sample of the analog signal.

Accordingly, the wrapper 700 provides dynamic adjustment of the resolution of the ADC 712 on a sample-by-sample basis, based on an amplitude of the analog signal coming in, to provide a larger dynamic range.

Figure 7B:
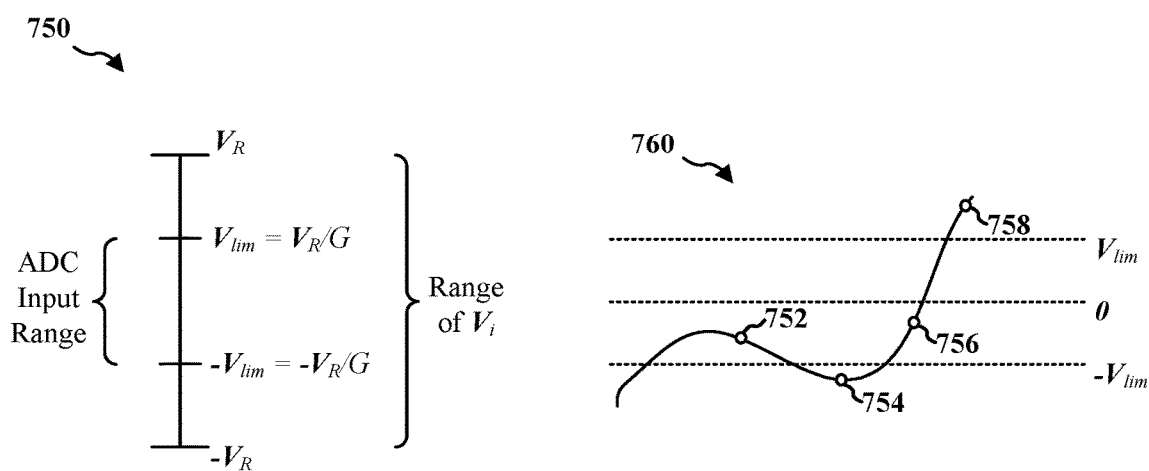
FIG. 7B is a diagram illustrating an example input voltage range of the ADC, and example of analog signal samples of an analog signal.

FIG. 7B is a diagram illustrating an example input voltage range 750 of the ADC 712, and example of analog signal samples of an analog signal 760.

As illustrated, the input voltage range 750 of the ADC 712 is defined by a maximum voltage of $V_{lim}$ and a minimum voltage of $-V_{lim}$. In contrast, the voltage range of analog input signal $V_i$ is defined by a maximum voltage of $V_R$ and a minimum voltage of $-V_R$, where $|V_R|$ is greater than $|V_{lim}|$. Here, the attenuator 708 and the amplifier 716 may be configured to scale/amplify a received signal by G, where $G=|V_R|/|V_{lim}|$. In some examples, G may be greater or less than $|V_R|/|V_{lim}|$. In certain aspects, the range detector 704 may select which path to use based on whether a first threshold condition is satisfied, or if a second threshold condition is satisfied. For example, the first threshold condition may be satisfied if a sample of an analog signal is within the range of $V_{lim}$ and $-V_{lim}$ (e.g., the first path 706 and the third path 714 are used). In another example, the second threshold condition may be satisfied if the sample of the analog signal is outside of the range of $V_{lim}$ and $-V_{lim}$ (e.g., the second path 710 and the fourth path 718 are used).

As shown in FIG. 7B, four samples may be taken from an example analog signal 760, including: a first sample 752, a second sample 754, a third sample 756, and a fourth sample 758. The first sample 752 and the third sample 756 are within the ADC 712 input voltage range, and thus, may be passed through the first path 706 and the third path 714 of the wrapper 700. In other words, the first sample 752 and the third sample 756 may not be attenuated or amplified prior/subsequent to ADC 712 operation. The second sample 754 and the fourth sample 758 are outside of the ADC 712 input voltage range, and thus, may be passed through the second path 710 and the fourth path 718 of the wrapper 700. That is, the second sample 754 and the fourth sample 758 may first be attenuated prior to being input into the ADC 712, then the resulting digital signals may be amplified to offset the prior attenuation.

Figure 8:
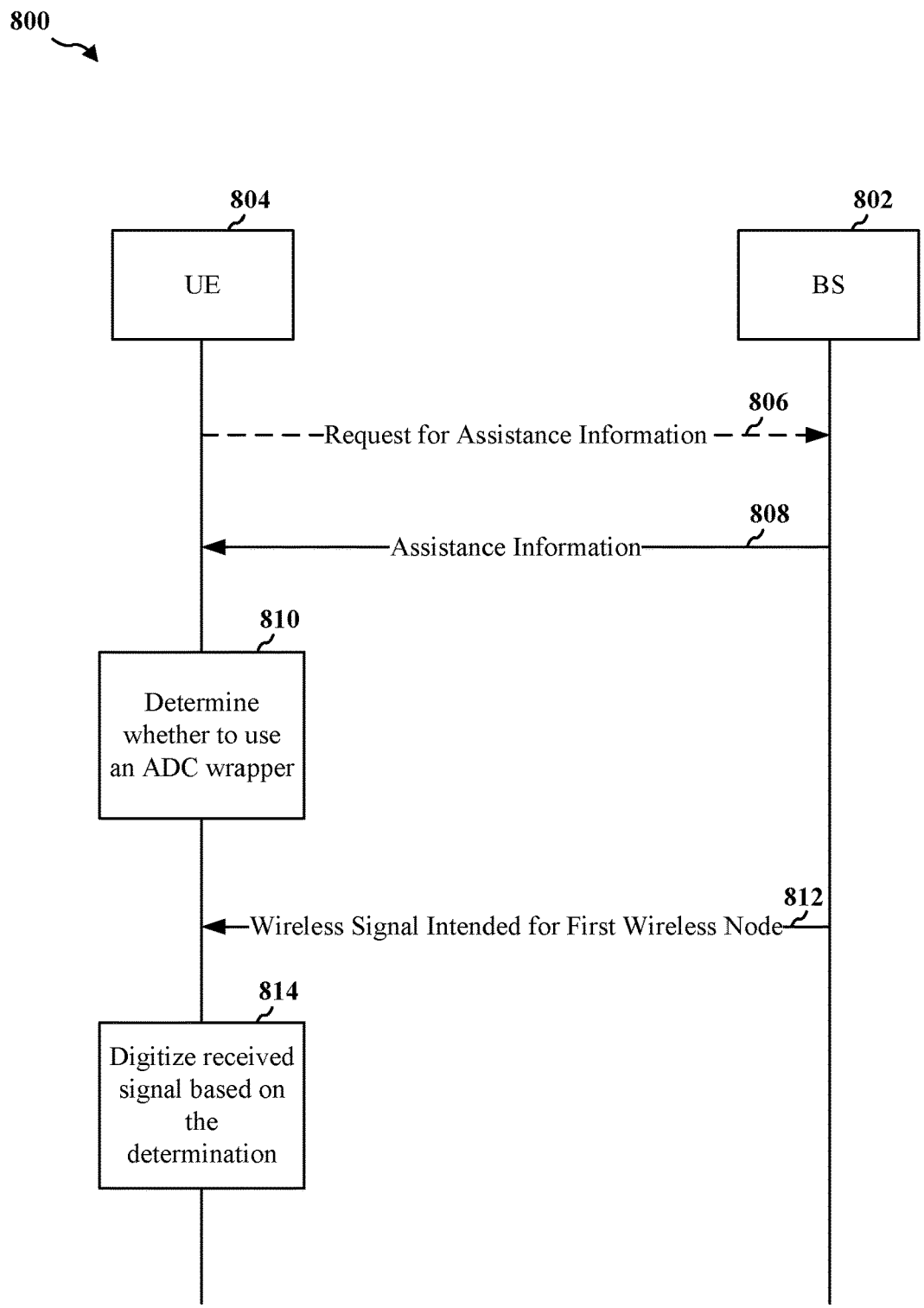
FIG. 8 is a call-flow diagram illustrating example communications between a UE and a base station (BS).

FIG. 8 is a call-flow diagram illustrating example communications 800 between a UE 804 (e.g., a UE 104 of FIG. 1) and a base station 802 (e.g., base station 102/180 of FIG. 1). At a first communication 806, the UE 804 may optionally request assistance information from the base station 802. The assistance information may include an indication of a type of duplex communication being used by one or more wireless nodes within at least one of a region or a cell. For example, the assistance information may indicate a type of communication that one or more wireless nodes use with the base station's 802 serving cell, a particular region or location within the serving cell, a particular region or location within another serving cell, or in a group of cells. In some examples, the indication of the type of duplex communication may include an indication of at least one of a full duplex type of communication, a static time division duplex (S-TDD) type of communication, or a dynamic time division duplex (D-TDD) type of communication. The request for assistance information may be transmitted to the base station 802 via a radio resource control (RRC) message or a medium-access control (MAC) control element (CE).

At a second communication 808, the base station 802 may transmit the assistance information to the UE 804. In some examples, the assistance information may be transmitted without a request from the UE 804. For example, if one or more wireless nodes begin communicating using full-duplex or D-TDD communications within the cell or near the cell, the base station 802 may be triggered to transmit the assistance information to the UE 804. In another example, the assistance information may be transmitted to the UE 804 in response to the request of the first communication 806. The assistance information may be transmitted to the UE 804 via RRC message or MAC CE.

Upon receiving the assistance information, the UE 804 may use the information to control the operation of its RF front end in a first operation 810. For example, the UE 804 may determine to use the wrapper 700 described above in FIG. 7A when full-duplex or D-TDD is used, and not use the wrapper 700 when S-TDD is used. By controlling when the wrapper 700 is used, the UE 804 may conserve power in situations where use of the wrapper 700 may not be needed. For example, in a serving cell where S-TDD is used, IDSI, DSI, CI, and other types of interference may be at a minimum or may not exists. Thus, the UE 804 may not use the range detector to perform sample-by-sample path selection. However, when the information indicates that full-duplex or D-TDD is used, the UE 804 may enable the wrapper 700 because there may be relatively more IDSI, DSI, CI, and other types of interference experienced by the UE 804.

At a third communication 812, the base station 802 may transmit downlink signaling to the UE 804. Upon receiving the downlink signaling, the UE 804 may perform a second operation 814 by digitizing the analog signal based on the assistance information. That is, if the UE 804 is configured to use the wrapper 700 when another device in the cell is communicating via D-TDD or full duplex, and the assistance information made such an indication, then the UE 804 may digitize the analog signal of the third communication 812 using the wrapper 700. Conversely, if the assistance information indicates that no other device is using a communication technique that could likely result in IDSI, DSI, CI, and other types of interference experienced at the UE 804, then the UE 804 may refrain from using the wrapper 700.

Figure 9:
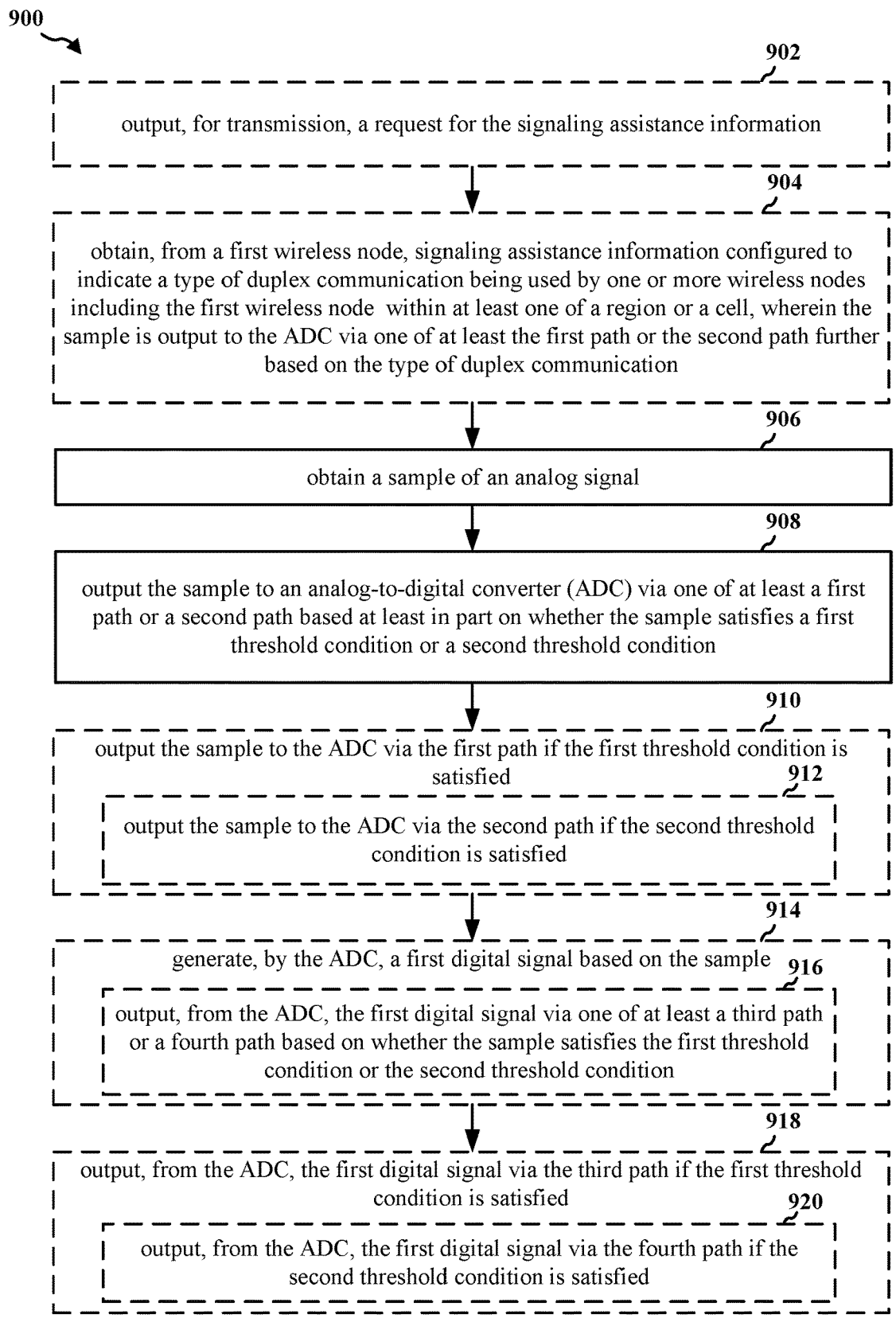
FIG. 9 is a flowchart of a method of wireless communication.

FIG. 9 is a flowchart 900 of a method of wireless communication performed by a wireless node. In some examples, the method may be performed by a UE (e.g., the UE 104 of FIG. 1; the apparatus 1002). In some examples, the method may be performed by a base station (e.g., the base station 102/180 of FIG. 1; the apparatus 1102). At 902, the wireless node may optionally output, for transmission, a request for the signaling assistance information. For example, 902 may be performed by a requesting component 1040/1140 of FIGS. 10 and 11. Here, the wireless node may transmit a request to another wireless node (e.g., a base station or UE) requesting that the other wireless node provide it with the assistance information.

At 904, the wireless node may optionally obtain, from a first wireless node, signaling assistance information configured to indicate a type of duplex communication being used by one or more wireless nodes including the first wireless node within at least one of a region or a cell, wherein the sample is output to the ADC via one of at least the first path or the second path further based on the type of duplex communication. For example, 904 may be performed by an obtaining component 1042/1142 of FIGS. 10 and 11. In some examples, the wireless node may receive an analog signal, and output a sample of the analog signal to an analog-to-digital converter (ADC) via one of at least the first path or the second path based at least in part on the type of duplex. Here, the wireless node may use assistance information received from another node to determine whether other wireless nodes in the same location and/or cell are using communication techniques that may cause the wireless node to experience interference. For example, full-duplex and D-TDD may cause such interference. If other nodes are using full-duplex and/or D-TDD, then the wireless node may determine to use the wrapper 700 of FIG. 7A to effectively expand the input voltage range of the ADC without clipping the analog signals. If the other nodes are not using communication techniques that may cause the wireless node to experience interference, then the wireless node may determine not to use the wrapper 700 of FIG. 7A to save power.

At 906, the wireless node may obtain a sample of an analog signal. For example, 906 may be performed by a sampling component 1044/1144 of FIGS. 10 and 11. Here, the wireless node may receive an analog signal via an air interface from another wireless node. The wireless node may include a sampler (e.g., sampler 702 of FIG. 7A) as part of an RF front end. The sample of the analog signal may be obtained by one or more of a range detector (e.g., range detector 704 of FIG. 7A), an attenuator (e.g., attenuator 708 of FIG. 7A), and/or an ADC (e.g., ADC 712 of FIG. 7A).

At 908, the wireless node may output the sample to an analog-to-digital converter (ADC) via one of at least a first path or a second path based at least in part on whether the sample satisfies a first threshold condition or a second threshold condition. For example, 908 may be performed by an ADC path component 1046/1146. Here, the range detector may receive a sample analog signal and determine whether the sample satisfies a first threshold condition or a second threshold condition. For example, the first threshold condition may be satisfied if a sample of an analog signal is within the range of $V_{lim}$ and $-V_{lim}$ (e.g., the first path 706 and the third path 714 are used). In another example, the second threshold condition may be satisfied if the sample of the analog signal is outside of the range of $V_{lim}$ and $-V_{lim}$ (e.g., the second path 710 and the fourth path 718 are used).

At 910, the wireless node may output the sample to the ADC via the first path if the first threshold condition is satisfied. For example, 910 may be performed by the ADC path component 1046/1146. Here, if the first threshold condition is satisfied, the first path 706 and the third path 714 are used. In other words, the sample is provided to the ADC without going through the attenuator 708 of FIG. 7A and is output from the ADC without going through the amplifier 716 of FIG. 7A.

At 912, the wireless node may output the sample to the ADC via the second path if the second threshold condition is satisfied. For example, 912 may be performed by the ADC path component 1046/1146 of FIGS. 10 and 11. Here, if the second threshold condition is satisfied, the second path 710 and the fourth path 718 are used. In other words, the sample is provided to the attenuator 708 of FIG. 7A prior to being passed to the ADC, and the digitized signal that is output from the ADC is passed through the amplifier 716 of FIG. 7A.

At 914, the wireless node may generate, by the ADC, a first digital signal based on the sample. For example, 914 may be performed by an ADC component 1048/1148 of FIGS. 10 and 11. Here, the ADC (e.g., ADC 712 of FIG. 7A) may receive an analog signal sample from the sampler 702 and convert it to a digital signal.

At 916, the wireless node may output, from the ADC, the first digital signal via one of at least a third path or a fourth path based on whether the sample satisfies the first threshold condition or the second threshold condition. For example, 916 may be performed by the ADC path component 1046/1146 of FIGS. 10 and 11.

At 918, the wireless node may output, from the ADC, the first digital signal via the third path if the first threshold condition is satisfied. For example, 918 may be performed by the ADC path component 1046/1146 of FIGS. 10 and 11.

At 920, the wireless node may output, from the ADC, the first digital signal via the fourth path if the second threshold condition is satisfied. For example, 920 may be performed by the ADC path component 1046/1146 of FIGS. 10 and 11.

In certain aspects, the first threshold condition comprises a first voltage range, and the second threshold condition comprises a second voltage range. For example, the first voltage range may be a range of input voltages within the operating range of the ADC (e.g., $V_{lim}$ to $-V_{lim}$). The second voltage range may include voltages that are outside of the input voltages that the ADC can handle. In some examples, the second voltage range may be defined by G, where $G=|V_R|/|V_{lim}|$. In such an example, the second voltage range may include voltages between $V_R$ and $V_{lim}$ and voltages between $-V_R$ and $-V_{lim}$ (e.g., voltage levels outside of the operating range of the ADC).

In certain aspects, the first voltage range comprises one or more voltage levels within an operating range of the ADC, and wherein the second voltage range comprises one or more voltage levels outside of the operating range of the ADC.

In certain aspects, the second path comprises an attenuator, and wherein the fourth path comprises an amplifier.

In certain aspects, the attenuator is configured to attenuate the sample by a first defined value, wherein the amplifier is configured to amplify the first digital signal by a second defined value, and wherein the second defined value is a function of the first defined value. For example, the first defined value may be 1/G, and the second defined value may be G.

In certain aspects, the signaling assistance information is received via a radio resource control (RRC) message or a medium-access control (MAC) control element (CE).

In certain aspects, the type of duplex communication comprises at least one of a full duplex communication, a static time division duplex (S-TDD) communication, or a dynamic time division duplex (D-TDD).

In certain aspects, the request for the signaling assistance information is output via a radio resource control (RRC) message or a medium-access control (MAC) control element (CE).

Figure 10:
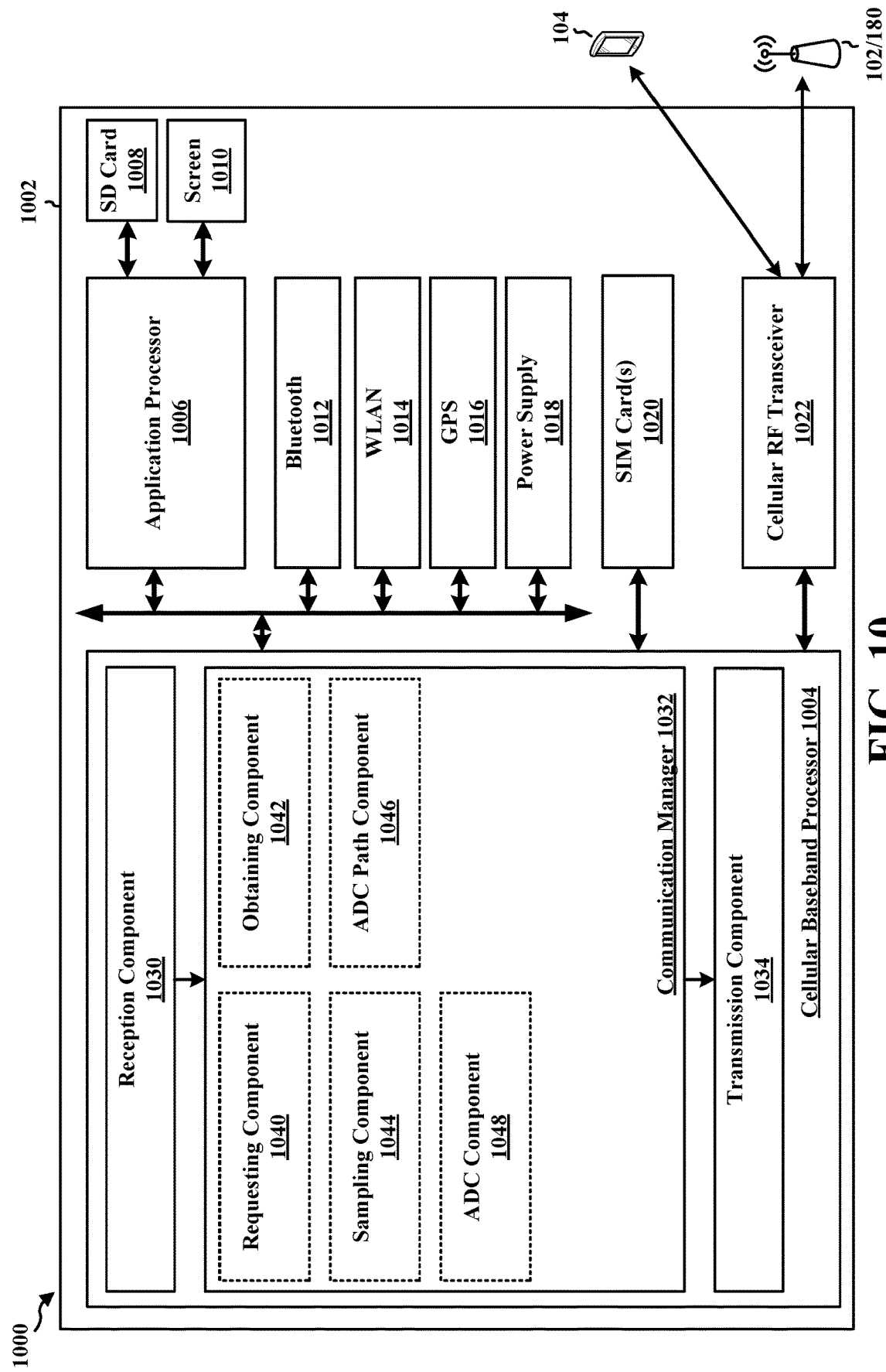
FIG. 10 is a diagram illustrating an example of a hardware implementation for an example apparatus.

FIG. 10 is a diagram 1000 illustrating an example of a hardware implementation for an apparatus 1002. The apparatus 1002 is a UE and includes a cellular baseband processor 1004 (also referred to as a modem) coupled to a cellular RF transceiver 1022 and one or more subscriber identity modules (SIM) cards 1020, an application processor 1006 coupled to a secure digital (SD) card 1008 and a screen 1010, a Bluetooth module 1012, a wireless local area network (WLAN) module 1014, a Global Positioning System (GPS) module 1016, and a power supply 1018. The cellular baseband processor 1004 communicates through the cellular RF transceiver 1022 with the UE 104 and/or BS 102/180. The cellular baseband processor 1004 may include a computer-readable medium/memory. The computer-readable medium/memory may be non-transitory. The cellular baseband processor 1004 is responsible for general processing, including the execution of software stored on the computer-readable medium/memory. The software, when executed by the cellular baseband processor 1004, causes the cellular baseband processor 1004 to perform the various functions described supra. The computer-readable medium/memory may also be used for storing data that is manipulated by the cellular baseband processor 1004 when executing software. The cellular baseband processor 1004 further includes a reception component 1030, a communication manager 1032, and a transmission component 1034. The communication manager 1032 includes the one or more illustrated components. The components within the communication manager 1032 may be stored in the computer-readable medium/memory and/or configured as hardware within the cellular baseband processor 1004. The cellular baseband processor 1004 may be a component of the UE 350 and may include the memory 360 and/or at least one of the TX processor 368, the RX processor 356, and the controller/processor 359. In one configuration, the apparatus 1002 may be a modem chip and include just the baseband processor 1004, and in another configuration, the apparatus 1002 may be the entire UE (e.g., see 350 of FIG. 3) and include the aforediscussed additional modules of the apparatus 1002.

The apparatus 1002 may also include one or more ADCs that are part of one or more components of the apparatus 1002. For example, the cellular baseband processor 1004 may include one or more ADCs (e.g., ADC component 1048) for sampling a received analog signal and converting the sampled signal into the digital domain.

The communication manager 1032 includes a requesting component 1040 that is configured to output, for transmission, a request for the signaling assistance information, e.g., as described in connection with 902 of FIG. 9.

The communication manager 1032 includes an obtaining component 1042 that is configured to obtain, from a first wireless node, signaling assistance information configured to indicate a type of duplex communication being used by one or more wireless nodes including the first wireless node within at least one of a region or a cell, wherein the sample is output to the ADC via one of at least the first path or the second path further based on the type of duplex communication, e.g., as described in connection with 904 of FIG. 9.

The communication manager 1032 includes a sampling component 1044 that is configured to obtain a sample of an analog signal, e.g., as described in connection with 906 of FIG. 9.

The communication manager 1032 includes an ADC path component 1046 that is configured to output the sample to an analog-to-digital converter (ADC) via one of at least a first path or a second path based at least in part on whether the sample satisfies a first threshold condition or a second threshold condition; output the sample to the ADC via the first path if the first threshold condition is satisfied; output the sample to the ADC via the second path if the second threshold condition is satisfied; output, from the ADC, the first digital signal via one of at least a third path or a fourth path based on whether the sample satisfies the first threshold condition or the second threshold condition; output, from the ADC, the first digital signal via the third path if the first threshold condition is satisfied; and output, from the ADC, the first digital signal via the fourth path if the second threshold condition is satisfied; e.g., as described in connection with 908, 910, 912, 916, 918, and 920 of FIG. 9.

The communication manager 1032 includes an ADC component 1048 that is configured to generate, by the ADC, a first digital signal based on the sample, e.g., as described in connection with 914 of FIG. 9.

The apparatus may include additional components that perform each of the blocks of the algorithm in the aforementioned flowchart of FIG. 9. As such, each block in the aforementioned flowchart of FIG. 9 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

In one configuration, the apparatus 1002, and in particular the cellular baseband processor 1004, includes means for obtaining a sample of an analog signal; means for output the sample to an analog-to-digital converter (ADC) via one of at least a first path or a second path based at least in part on whether the sample satisfies a first threshold condition or a second threshold condition; means for outputting the sample to the ADC via the first path if the first threshold condition is satisfied; means for outputting the sample to the ADC via the second path if the second threshold condition is satisfied; means for generating, by the ADC, a first digital signal based on the sample; means for output, from the ADC, the first digital signal via one of at least a third path or a fourth path based on whether the sample satisfies the first threshold condition or the second threshold condition; means for outputting, from the ADC, the first digital signal via the third path if the first threshold condition is satisfied; means for outputting, from the ADC, the first digital signal via the fourth path if the second threshold condition is satisfied; means for obtaining, from a first wireless node, signaling assistance information configured to indicate a type of duplex communication being used by one or more wireless nodes including the first wireless node within at least one of a region or a cell, wherein the sample is output to the ADC via one of at least the first path or the second path further based on the type of duplex communication; means for outputting the sample to an analog-to-digital converter (ADC) via one of at least the first path or the second path based at least in part on the type of duplex; and means for outputting, for transmission, a request for the signaling assistance information. The aforementioned means may be one or more of the aforementioned components of the apparatus 1002 configured to perform the functions recited by the aforementioned means. As described supra, the apparatus 1002 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

Figure 11:
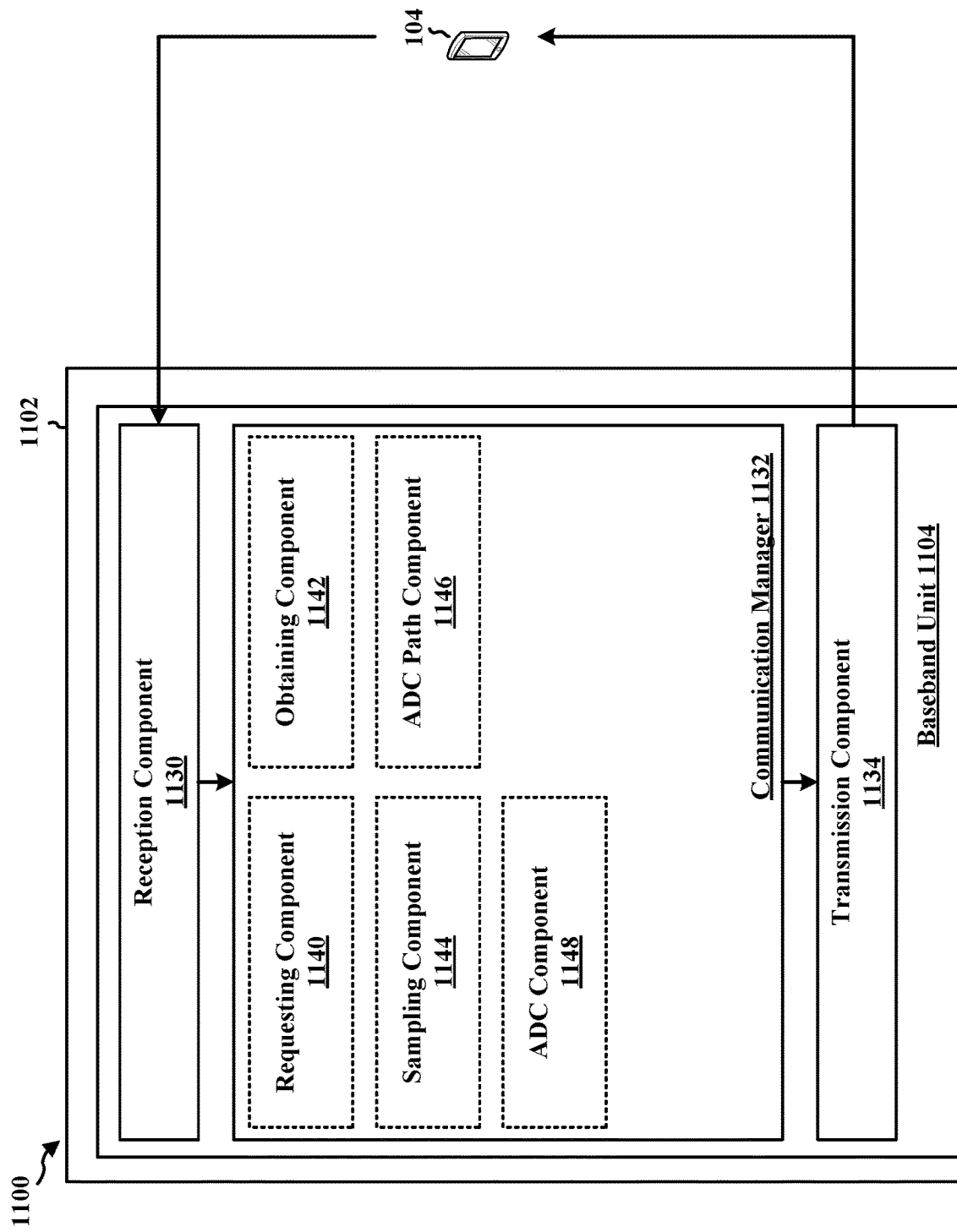
FIG. 11 is a diagram illustrating another example of a hardware implementation for another example apparatus.

FIG. 11 is a diagram 1100 illustrating an example of a hardware implementation for an apparatus 1102. The apparatus 1102 is a BS and includes a baseband unit 1104. The baseband unit 1104 may communicate through a cellular RF transceiver with the UE 104. The baseband unit 1104 may include a computer-readable medium/memory. The baseband unit 1104 is responsible for general processing, including the execution of software stored on the computer-readable medium/memory. The software, when executed by the baseband unit 1104, causes the baseband unit 1104 to perform the various functions described supra. The computer-readable medium/memory may also be used for storing data that is manipulated by the baseband unit 1104 when executing software. The baseband unit 1104 further includes a reception component 1130, a communication manager 1132, and a transmission component 1134. The communication manager 1132 includes the one or more illustrated components. The components within the communication manager 1132 may be stored in the computer-readable medium/memory and/or configured as hardware within the baseband unit 1104. The baseband unit 1104 may be a component of the BS 310 and may include the memory 376 and/or at least one of the TX processor 316, the RX processor 370, and the controller/processor 375.

The apparatus 1102 may also include one or more ADCs that are part of one or more components of the apparatus 1102. For example, the baseband unit 1104 may include one or more ADCs (e.g., ADC component 1148) for sampling a received analog signal and converting the sampled signal into the digital domain.

The communication manager 1132 includes a requesting component 1140 that is configured to output, for transmission, a request for the signaling assistance information, e.g., as described in connection with 902 of FIG. 9.

The communication manager 1132 includes an obtaining component 1142 that is configured to obtain, from a first wireless node, signaling assistance information configured to indicate a type of duplex communication being used by one or more wireless nodes including the first wireless node within at least one of a region or a cell, wherein the sample is output to the ADC via one of at least the first path or the second path further based on the type of duplex communication, e.g., as described in connection with 904 of FIG. 9.

The communication manager 1132 includes a sampling component 1144 that is configured to obtain a sample of an analog signal, e.g., as described in connection with 906 of FIG. 9.

The communication manager 1132 includes an ADC path component 1146 that is configured to output the sample to an analog-to-digital converter (ADC) via one of at least a first path or a second path based at least in part on whether the sample satisfies a first threshold condition or a second threshold condition; output the sample to the ADC via the first path if the first threshold condition is satisfied; output the sample to the ADC via the second path if the second threshold condition is satisfied; output, from the ADC, the first digital signal via one of at least a third path or a fourth path based on whether the sample satisfies the first threshold condition or the second threshold condition; output, from the ADC, the first digital signal via the third path if the first threshold condition is satisfied; and output, from the ADC, the first digital signal via the fourth path if the second threshold condition is satisfied; e.g., as described in connection with 908, 910, 912, 916, 918, and 920 of FIG. 9.

The communication manager 1132 includes an ADC component 1148 that is configured to generate, by the ADC, a first digital signal based on the sample, e.g., as described in connection with 914 of FIG. 9.

The apparatus may include additional components that perform each of the blocks of the algorithm in the aforementioned flowchart of FIG. 9. As such, each block in the aforementioned flowchart may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

In one configuration, the apparatus 1102, and in particular the baseband unit 1104, includes means for obtaining a sample of an analog signal; means for output the sample to an analog-to-digital converter (ADC) via one of at least a first path or a second path based at least in part on whether the sample satisfies a first threshold condition or a second threshold condition; means for outputting the sample to the ADC via the first path if the first threshold condition is satisfied; means for outputting the sample to the ADC via the second path if the second threshold condition is satisfied; means for generating, by the ADC, a first digital signal based on the sample; means for output, from the ADC, the first digital signal via one of at least a third path or a fourth path based on whether the sample satisfies the first threshold condition or the second threshold condition; means for outputting, from the ADC, the first digital signal via the third path if the first threshold condition is satisfied; means for outputting, from the ADC, the first digital signal via the fourth path if the second threshold condition is satisfied; means for obtaining, from a first wireless node, signaling assistance information configured to indicate a type of duplex communication being used by one or more wireless nodes including the first wireless node within at least one of a region or a cell, wherein the sample is output to the ADC via one of at least the first path or the second path further based on the type of duplex communication; means for outputting the sample to an analog-to-digital converter (ADC) via one of at least the first path or the second path based at least in part on the type of duplex; and means for outputting, for transmission, a request for the signaling assistance information. The aforementioned means may be one or more of the aforementioned components of the apparatus 1102 configured to perform the functions recited by the aforementioned means. As described supra, the apparatus 1102 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

Figure 12:
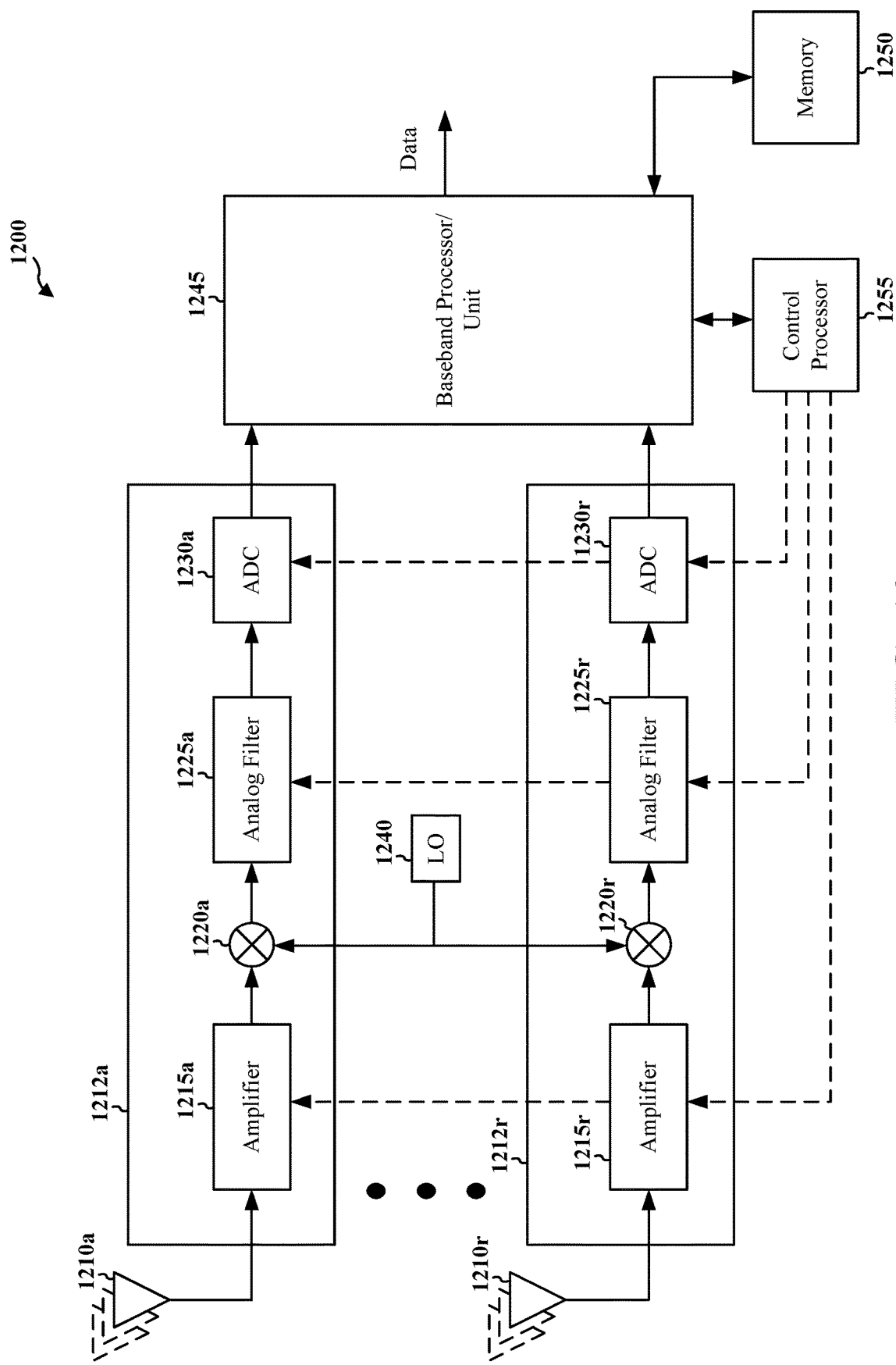
FIG. 12 is a high-level block diagram of a receiver.

FIG. 12 is a high-level block diagram of a receiver 1200. The receiver 1200 may be included in a UE (e.g., UE 104 of FIG. 1, UE 350 of FIG. 3, apparatus 1000/1100 of FIGS. 10 and 11) or a base station (e.g., base station 102 of FIG. 1, base station 310 of FIG. 3, apparatus 1000/1100 of FIGS. 10 and 11). The receiver 1200 may include one or more antennas 1210 (e.g., antennas 320/352 of FIG. 3). If the receiver 1200 includes multiple antennas 1210, any technique for multiple-input multiple-output communication (MIMO) may be employed. For convenience, the description will focus on one antenna 1210a and its associated components with the understanding that the description applies to each antenna and its associated components.

In this example, the receiver 1200 includes an RF front end 1212a. In this example, the RF front end 1212a includes an amplifier 1215a, a mixer 1220a, an analog filter 1225a, and an ADC 1230a in communication with the antenna 1210a as shown. The receiver 1200 may employs an intermediate frequency (IF) architecture in which an analog signal received at antenna 1210a is amplified by amplifier 1215a and then down-converted directly to baseband by mixer 1220a in conjunction with local oscillator (LO) 1240. An RF amplifier, such as a low-noise amplifier (LNA), is an example of the amplifier 1215a.

The analog filter 1225a may be a low-pass filter with an adjustable bandwidth. The received signal is typically a sum of a desired data-carrying signal, interference, and noise. In some scenarios, the bandwidth of the analog filter 1225a is set to prevent aliasing, permit the desired signal to pass with relatively little distortion to ADC 1230a, and attenuate out of band interference and noise.

The ADC 1230a may receive an analog signal at its input, then sample and digitize the analog signal to produce a digital output. The sampling rate of the ADC 1230a may be configured to prevent or sufficiently limit aliasing of the signal (e.g., generally at least twice the highest frequency component of the input signal). The sampling rate of the ADC 1230a may be adjustable to satisfy the desired sampling rate according to signals with different input bandwidths.

The receiver 1200 further includes a baseband processor 1245 (e.g., cellular baseband processor 1004 or baseband unit 1104). The baseband processor 1245 may receive the signals from all receive chains and performs demodulation and decoding (if needed) of the received signals. Although the baseband processor 1245 is illustrated as external to the RF front end 1212a, it should be noted that the RF front end 1212a may form a part of the baseband processor 1245.

The receiver 1200 further includes a control processor 1255 (e.g., controller/processor 375/359 of FIG. 3, cellular baseband processor 1004 and/or communication manager 1032 of FIG. 10, baseband unit 1104 and/or communication manager 1132 of FIG. 11). The control processor 1255 may direct the operation of the receiver 1200. The control processor 1255 generates one or more command signals (represented by dashed lines) intended for amplifiers 1215, analog filters 1225, ADCs 1230, and/or the baseband processor 1245. The command signals may also be referred to herein as internal control signals to distinguish the nomenclature from the uplink and downlink control signals transmitted over wireless channels.

The receiver 1200 further includes a memory 1250 (e.g., memory 376/360 of FIG. 3, the computer-readable medium/memory within the baseband processor/unit 1004/1104 of FIGS. 10 and 11). The memory 1250 may be any electronic component capable of storing information and/or instructions. For example, the memory 1250 may include random access memory (RAM), read-only memory (ROM), flash memory devices in RAM, optical storage media, erasable programmable read-only memory (EPROM), registers, or combinations thereof. In an embodiment, the memory 1250 includes a non-transitory computer-readable medium.

Instructions or code may be stored in the memory 1250 that are executable by the baseband processor 1245 and/or the control processor 1255. The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may include a single computer-readable statement or many computer-readable statements.

In some examples, the instructions or code stored in the memory 1250 may be executed by the baseband processor 1245 and/or the control processor 1255 to perform the steps illustrated and described throughout the disclosure. For example, the steps and communications illustrated in FIGS. 8 and 9.

Additional Considerations

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Terms such as "if," "when," and "while" should be interpreted to mean "under the condition that" rather than imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

EXAMPLE ASPECTS

The following examples are illustrative only and may be combined with aspects of other embodiments or teachings described herein, without limitation.

Example 1 is a method for wireless communication at a wireless node, comprising: obtaining a sample of an analog signal; and outputting the sample to an analog-to-digital converter (ADC) via one of at least a first path or a second path based at least in part on whether the sample satisfies a first threshold condition or a second threshold condition.

Example 2 is the method of example 1, further comprising: outputting the sample to the ADC via the first path if the first threshold condition is satisfied; and outputting the sample to the ADC via the second path if the second threshold condition is satisfied.

Example 3 is the method of any of examples 1 and 2, wherein the first threshold condition comprises a first voltage range, and the second threshold condition comprises a second voltage range.

Example 4 is the method of example 3, wherein the first voltage range comprises one or more voltage levels within an operating range of the ADC, and wherein the second voltage range comprises one or more voltage levels outside of the operating range of the ADC.

Example 5 is the method of any of examples 1-4, further comprising: generating, by the ADC, a first digital signal based on the sample; and outputting, from the ADC, the first digital signal via one of at least a third path or a fourth path based on whether the sample satisfies the first threshold condition or the second threshold condition.

Example 6 is the method of example 5, further comprising: outputting, from the ADC, the first digital signal via the third path if the first threshold condition is satisfied; and outputting, from the ADC, the first digital signal via the fourth path if the second threshold condition is satisfied.

Example 7 is the method of any of examples 5 and 6, wherein the second path comprises an attenuator, wherein the fourth path comprises an amplifier, and wherein the method further comprises scaling, by the attenuator, the sample by a first defined value; and amplifying, by the amplifier, the first digital signal by a second defined value, wherein the second defined value is a function of the first defined value.

Example 8 is the method of any of examples 1-7, further comprising obtaining, from a first wireless node, signaling assistance information configured to indicate a type of duplex communication being used by one or more wireless nodes including the first wireless node within at least one of a region or a cell, wherein the sample is output to the ADC via one of at least the first path or the second path further based on the type of duplex communication.

Example 9 is the method of example 8, wherein the signaling assistance information is obtained via a radio resource control (RRC) message or a medium-access control (MAC) control element (CE).

Example 10 is the method of any of examples 8 and 9, wherein the type of duplex communication comprises at least one of a full duplex communication, a static time division duplex (S-TDD) communication, or a dynamic time division duplex (D-TDD).

Example 11 is the method of any of examples 8-10, further comprising outputting, for transmission, a request for the signaling assistance information.

Example 12 is the method of example 11, wherein the request for the signaling assistance information is output via a radio resource control (RRC) message or a medium-access control (MAC) control element (CE).

Example 13 is a wireless node configured for wireless communication, comprising: a transceiver; an analog-to-digital converter (ADC); a memory comprising instructions; and one or more processors configured to execute the instructions to cause the wireless node to perform a method in accordance with any one of examples 1-12, wherein the transceiver is configured to receive an analog signal.

Example 14 is an apparatus configured for wireless communication, comprising: a memory comprising instructions; and one or more processors configured to execute the instructions and cause the apparatus to perform a method in accordance with any one of examples 1-12.

Example 15 is an apparatus for wireless communications, comprising means for performing a method in accordance with any one of examples 1-12.

Example 16 is a non-transitory computer-readable medium comprising instructions that, when executed by an apparatus, cause the apparatus to perform a method in accordance with any one of examples 1-12.

What is claimed is:

1. A apparatus configured for wireless communication, comprising:
    a memory comprising instructions; and
    one or more processors configured to execute the instructions and cause the apparatus to:
    obtain a sample of an analog signal; and
    output the sample to an analog-to-digital converter (ADC) via one of at least a first path or a second path based at least in part on whether the sample satisfies a first threshold condition or a second threshold condition.

2. The apparatus of claim 1, wherein the one or more processors are further configured to cause the apparatus to:
    output the sample to the ADC via the first path if the first threshold condition is satisfied; and
    output the sample to the ADC via the second path if the second threshold condition is satisfied.

3. The apparatus of claim 1, wherein the first threshold condition comprises a first voltage range, and the second threshold condition comprises a second voltage range.

4. The apparatus of claim 3, wherein the first voltage range comprises one or more voltage levels within an operating range of the ADC, and wherein the second voltage range comprises one or more voltage levels outside of the operating range of the ADC.

5. The apparatus of claim 1, wherein the apparatus further comprises the ADC, and wherein the one or more processors are further configured to cause the apparatus to:
    generate, by the ADC, a first digital signal based on the sample; and
    output, from the ADC, the first digital signal via one of at least a third path or a fourth path based on whether the sample satisfies the first threshold condition or the second threshold condition.

6. The apparatus of claim 5, wherein the one or more processors are further configured to cause the apparatus to:
    output, from the ADC, the first digital signal via the third path if the first threshold condition is satisfied; and
    output, from the ADC, the first digital signal via the fourth path if the second threshold condition is satisfied.

7. The apparatus of claim 5, wherein the second path comprises an attenuator, and wherein the fourth path comprises an amplifier.

8. The apparatus of claim 7, wherein the attenuator is configured to attenuate the sample by a first defined value, wherein the amplifier is configured to amplify the first digital signal by a second defined value, and wherein the second defined value is a function of the first defined value.

9. The apparatus of claim 1, wherein the one or more processors are further configured to cause the apparatus to:
    obtain, from a first wireless node, signaling assistance information configured to indicate a type of duplex communication being used by one or more wireless nodes including the first wireless node within at least one of a region or a cell, wherein the sample is output to the ADC via one of at least the first path or the second path further based on the type of duplex communication.

10. The apparatus of claim 9, wherein the signaling assistance information is obtained via a radio resource control (RRC) message or a medium-access control (MAC) control element (CE).

11. The apparatus of claim 9, wherein the type of duplex communication comprises at least one of a full duplex communication, a static time division duplex (S-TDD) communication, or a dynamic time division duplex (D-TDD).

12. The apparatus of claim 9, wherein the one or more processors are further configured to cause the apparatus to:
    output, for transmission, a request for the signaling assistance information.

13. The apparatus of claim 12, wherein the request for the signaling assistance information is output via a radio resource control (RRC) message or a medium-access control (MAC) control element (CE).

14. A method for wireless communication at a wireless node, comprising:
    obtaining a sample of an analog signal; and
    outputting the sample to an analog-to-digital converter (ADC) via one of at least a first path or a second path based at least in part on whether the sample satisfies a first threshold condition or a second threshold condition.

15. The method of claim 14, further comprising:
    outputting the sample to the ADC via the first path if the first threshold condition is satisfied; and
    outputting the sample to the ADC via the second path if the second threshold condition is satisfied.

16. The method of claim 14, further comprising:
    generating, by the ADC, a first digital signal based on the sample; and
    outputting, from the ADC, the first digital signal via one of at least a third path or a fourth path based on whether the sample satisfies the first threshold condition or the second threshold condition.

17. The method of claim 16, further comprising:
    output, from the ADC, the first digital signal via the third path if the first threshold condition is satisfied; and
    output, from the ADC, the first digital signal via the fourth path if the second threshold condition is satisfied.

18. The method of claim 16, wherein the second path comprises an attenuator, and wherein the fourth path comprises an amplifier, and wherein the method further comprises:
    scaling, by the attenuator, the sample by a first defined value; and amplifying, by the amplifier, the first digital signal by a second defined value, wherein the second defined value is a function of the first defined value.

19. The method of claim 14, further comprising:
outputting, for transmission, a request for signaling assistance information.

20. A wireless node configured for wireless communication, comprising:
a transceiver;
an analog-to-digital converter (ADC);
a memory comprising instructions; and
one or more processors configured to execute the instructions to cause the wireless node to:
receive an analog signal; and
output a sample of the analog signal to the ADC via one of at least a first path or a second path based at least in part on whether the sample satisfies a first threshold condition or a second threshold condition, wherein the wireless node is one of a user equipment (UE) or a base station.

* * * * *